(12) United States Patent
Seki

(10) Patent No.: US 12,066,815 B2
(45) Date of Patent: Aug. 20, 2024

(54) RECIPE CREATION METHOD OR APPARATUS UTILIZING A SERIES OF STEPS ACCORDING TO A TARGET RECIPE FILE FOR SEMICONDUCTOR MANUFACTURING OR SUBSTRATING PROCESSING

(71) Applicant: Kokusai Electric Corporation, Tokyo (JP)

(72) Inventor: Takatoshi Seki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 377 days.

(21) Appl. No.: 17/477,249

(22) Filed: Sep. 16, 2021

(65) Prior Publication Data

US 2022/0004172 A1    Jan. 6, 2022

Related U.S. Application Data

(63) Continuation of application No. PCT/JP2019/011897, filed on Mar. 20, 2019.

(51) Int. Cl.
  *G05B 99/00*   (2006.01)
  *G05B 19/418*  (2006.01)
  *H01L 21/67*   (2006.01)

(52) U.S. Cl.
  CPC .. *G05B 19/41865* (2013.01); *H01L 21/67248* (2013.01); *H01L 21/67253* (2013.01);
  (Continued)

(58) Field of Classification Search
  CPC .......................................... G05B 2219/32097
  See application file for complete search history.

(56) References Cited

U.S. PATENT DOCUMENTS 6,000,830 A * 12/1999 Asano .............. G05B 19/41855
                                                     700/121
6,907,308 B1 *  6/2005 Bartlett ............ G05B 19/41865
                                                     700/121

(Continued)

FOREIGN PATENT DOCUMENTS

JP  2000-077288 A  3/2000
JP  2000-133595 A  5/2000

(Continued)

OTHER PUBLICATIONS

International Search Report, PCT/JP2019/011897, Jun. 25, 2019, 1 pg.

*Primary Examiner* — Suresh Suryawanshi
(74) *Attorney, Agent, or Firm* — Volpe Koenig

(57) ABSTRACT

There is provided a technique that includes: displaying a recipe editing screen including at least a selection screen area that displays a parameter list for selection of parameters included in a recipe of a substrate processing apparatus, and a parameter editing screen area that edits the parameters; receiving a selection operation that selects an editing target parameter from the parameter list; displaying, on the parameter editing screen area, in an editable manner, a timing chart that is changeable at a time of each process in a series of processes included in a substrate processing process; and editing the editing target parameter by receiving an operation instruction to edit the timing chart displayed on the parameter editing screen area and changing the timing chart according to the operation instruction.

15 Claims, 22 Drawing Sheets

(52) U.S. Cl.
CPC ............. *H01L 21/67276* (2013.01); *G05B 2219/32095* (2013.01); *G05B 2219/32097* (2013.01); *G05B 2219/45031* (2013.01); *H01L 21/67155* (2013.01)

(56) References Cited

U.S. PATENT DOCUMENTS

| | | | | |
|---|---|---|---|---|
| 2007/0038324 | A1* | 2/2007 | Takizawa | G05B 19/0426 700/105 |
| 2008/0178119 | A1* | 7/2008 | Nogami | G06F 3/04847 715/810 |
| 2009/0235865 | A1* | 9/2009 | Nakagawa | H01L 21/67005 118/696 |
| 2013/0014251 | A1* | 1/2013 | Nogami | G06F 21/34 726/19 |
| 2013/0053996 | A1* | 2/2013 | Wu | G05B 19/41865 700/100 |
| 2018/0284716 | A1* | 10/2018 | Takenaga | G05B 19/188 |
| 2020/0216961 | A1* | 7/2020 | Nomura | C23C 16/507 |

FOREIGN PATENT DOCUMENTS

| | | | | |
|---|---|---|---|---|
| JP | 2006093615 | A | * | 4/2006 |
| JP | 2007194446 | A | * | 8/2007 |
| JP | 2007266263 | A | * | 10/2007 |
| JP | 2009010029 | A | * | 1/2009 |
| JP | 2014067936 | A | * | 4/2014 |
| KR | 20080031624 | A | * | 4/2008 |
| KR | 20080083594 | A | * | 9/2008 |
| KR | 20110048503 | A | * | 5/2011 |
| KR | 20180111568 | A | * | 10/2018 |

\* cited by examiner

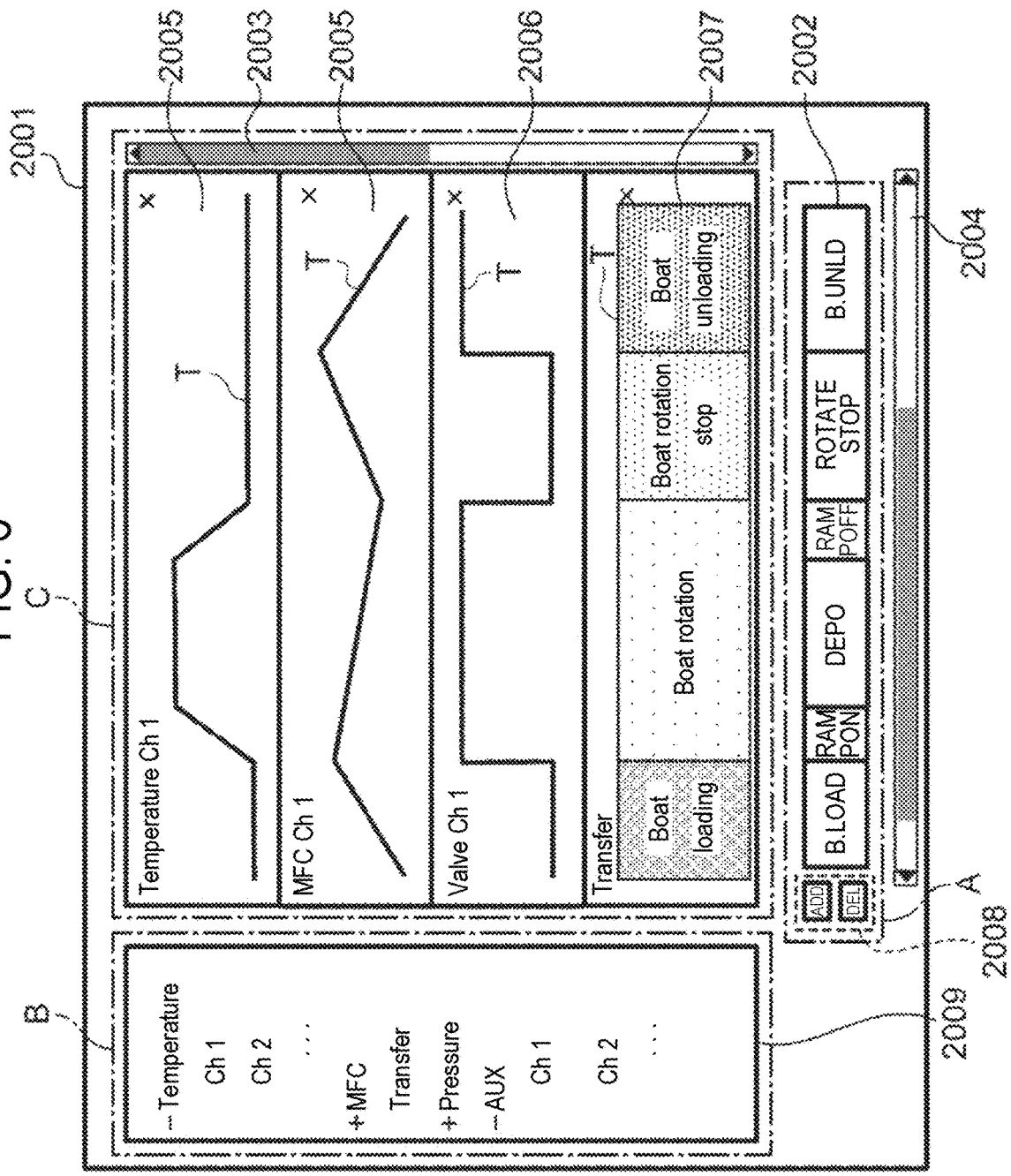

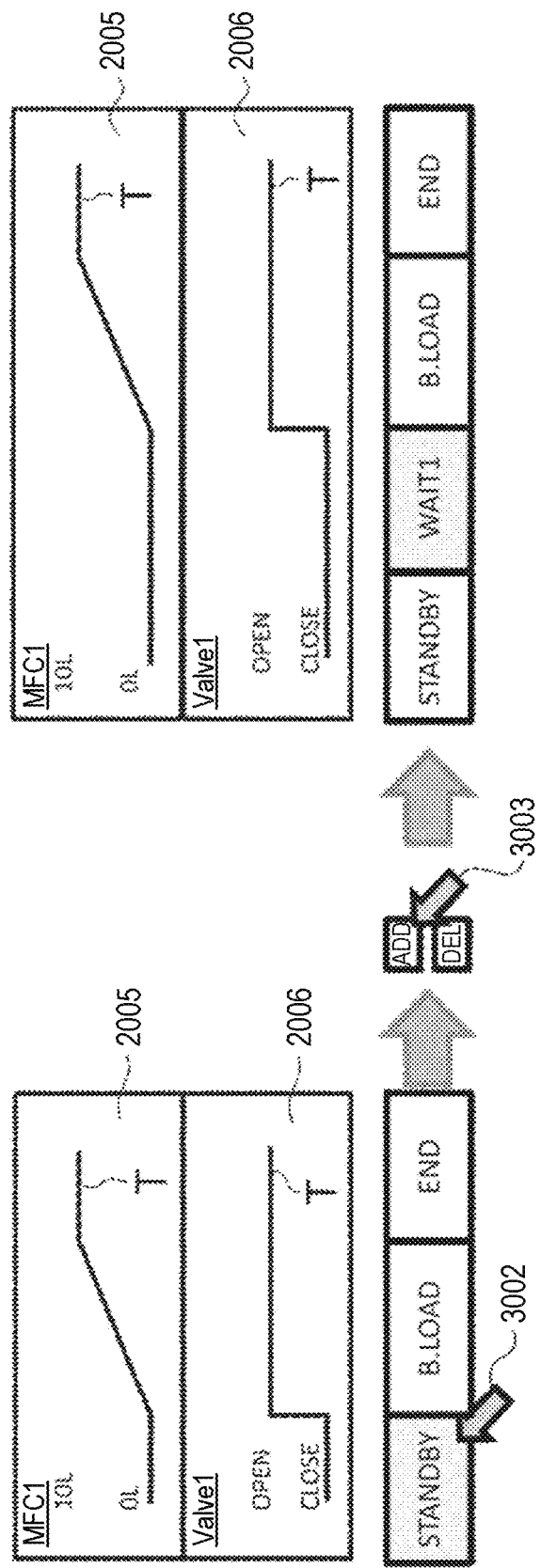

RECIPE CREATION METHOD OR APPARATUS UTILIZING A SERIES OF STEPS ACCORDING TO A TARGET RECIPE FILE FOR SEMICONDUCTOR MANUFACTURING OR SUBSTRATING PROCESSING

CROSS-REFERENCE TO RELATED APPLICATION

This application is a Bypass Continuation Application of PCT International Application No. PCT/JP2019/011897, filed on Mar. 20, 2019, the entire contents of which are incorporated herein by reference.

TECHNICAL FIELD

The present disclosure relates to a recipe creation method, a substrate processing apparatus, a computer-readable recording medium storing a recipe creation program, and a semiconductor device manufacturing method.

BACKGROUND

In a substrate processing apparatus such as a film-forming apparatus or the like, a process gas may be supplied to and heated in a process chamber, a pressure and a temperature in the process chamber may be set to predetermined values, and various processes may be performed on a surface of a substrate. When a thin film formation process is performed on a substrate in a substrate processing apparatus, a recipe is created to set process conditions.

In order to perform a desired process on a product substrate, it is necessary to create an optimum recipe. For example, in the related art, there is known a method of efficiently creating a recipe using common use parameters. Furthermore, for example, in the related art, there is known a technique in which when a recipe editing screen is displayed and a recipe is created, a designated step number is designated and parameters necessary in each step are copied.

However, it may be difficult to grasp changes from steps before and after a certain step while the certain step is being edited, and thus, there may be a concern that the work efficiency in recipe editing decreases and editing errors occur. Furthermore, for a problem that if all the settable items are displayed, it is difficult to know which item is set at first glance, it is preferable to perform editing while grasping the entire recipe and to check only the set items.

SUMMARY

Some embodiments of the present disclosure provide a technique that makes it possible to perform recipe editing with significantly improved operability by improving a recipe editing function.

According to one embodiment of the present disclosure, there is provided a technique that includes: displaying, on a display, a recipe editing screen including at least a selection screen area that displays a parameter list for selection of parameters included in a recipe of a substrate processing apparatus, and a parameter editing screen area that edits the parameters; receiving a selection operation that selects an editing target parameter from the parameter list displayed on the selection screen area; displaying, on the parameter editing screen area, in an editable manner, a timing chart that is changeable at a time of each process included in a substrate processing process; and editing the editing target parameter by receiving an operation instruction to edit the timing chart displayed on the parameter editing screen area and changing the timing chart according to the operation instruction.

As used herein, the term "recipe" refers to a record of process conditions for a substrate such as a combination of commands, settings, and parameters for a substrate processing apparatus.

BRIEF DESCRIPTION OF DRAWINGS

The accompanying drawings, which are incorporated in and constitute a part of the specification, illustrate embodiments of the present disclosure.

FIG. 6 shows an example of the recipe editing screen according to the embodiment of the present disclosure.

FIG. 12B is a diagram illustrating the step editing process according to the embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, a substrate processing apparatus according to an embodiment of the present disclosure will be described with reference to the drawings. In the present embodiment, the substrate processing apparatus is configured, for example, as an apparatus for carrying out a plurality of processing steps in the production of a substrate. In the following description, a batch type vertical semiconductor manufacturing apparatus (hereinafter, simply referred to as a substrate processing apparatus) that performs an oxidation process, a diffusion process, a CVD (Chemical Vapor Deposition) process and the like on a substrate will be described as the substrate processing apparatus.

Figure 1:
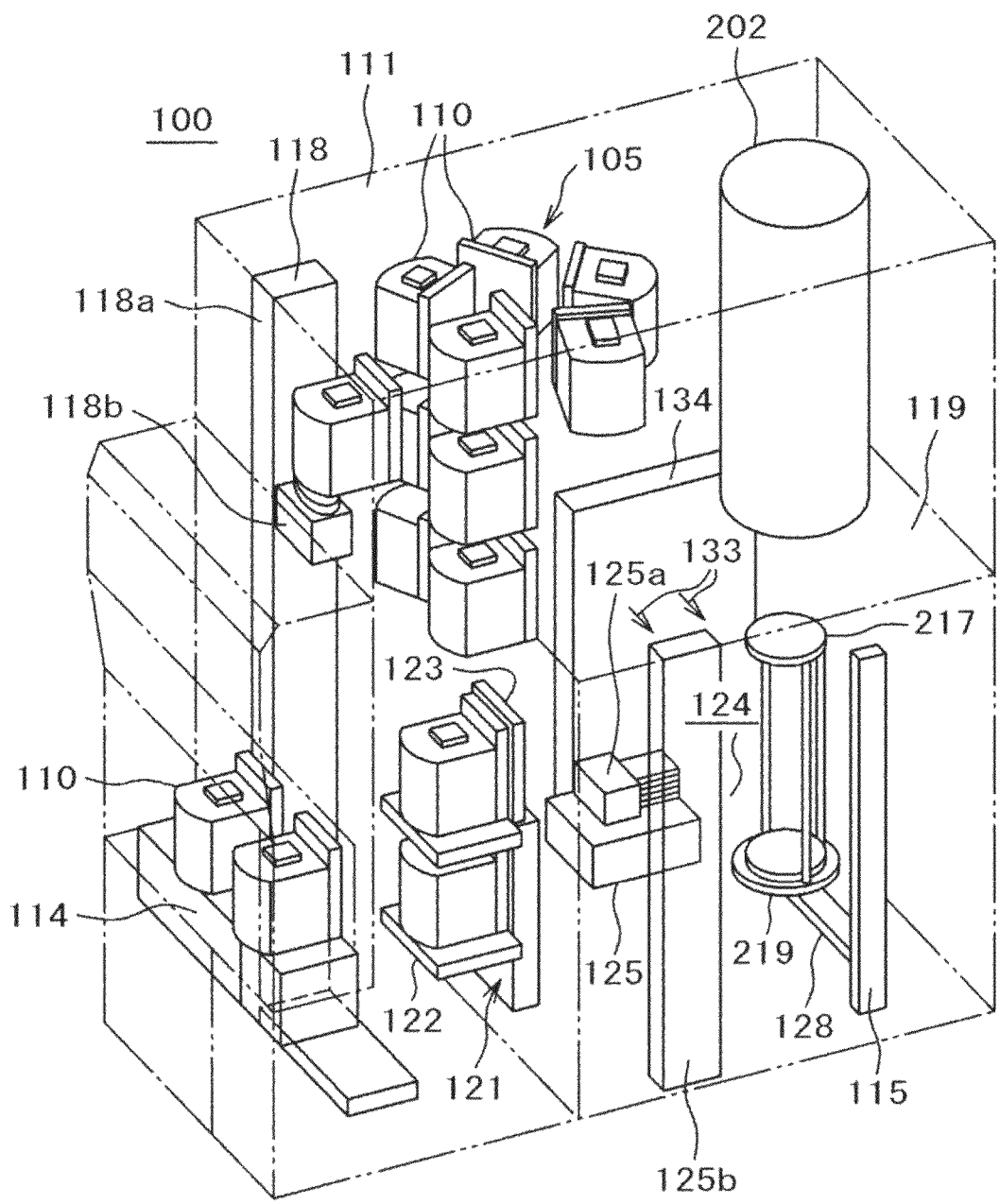
FIG. 1 is a perspective view of a substrate processing apparatus according to an embodiment of the present disclosure.
Figure 2:
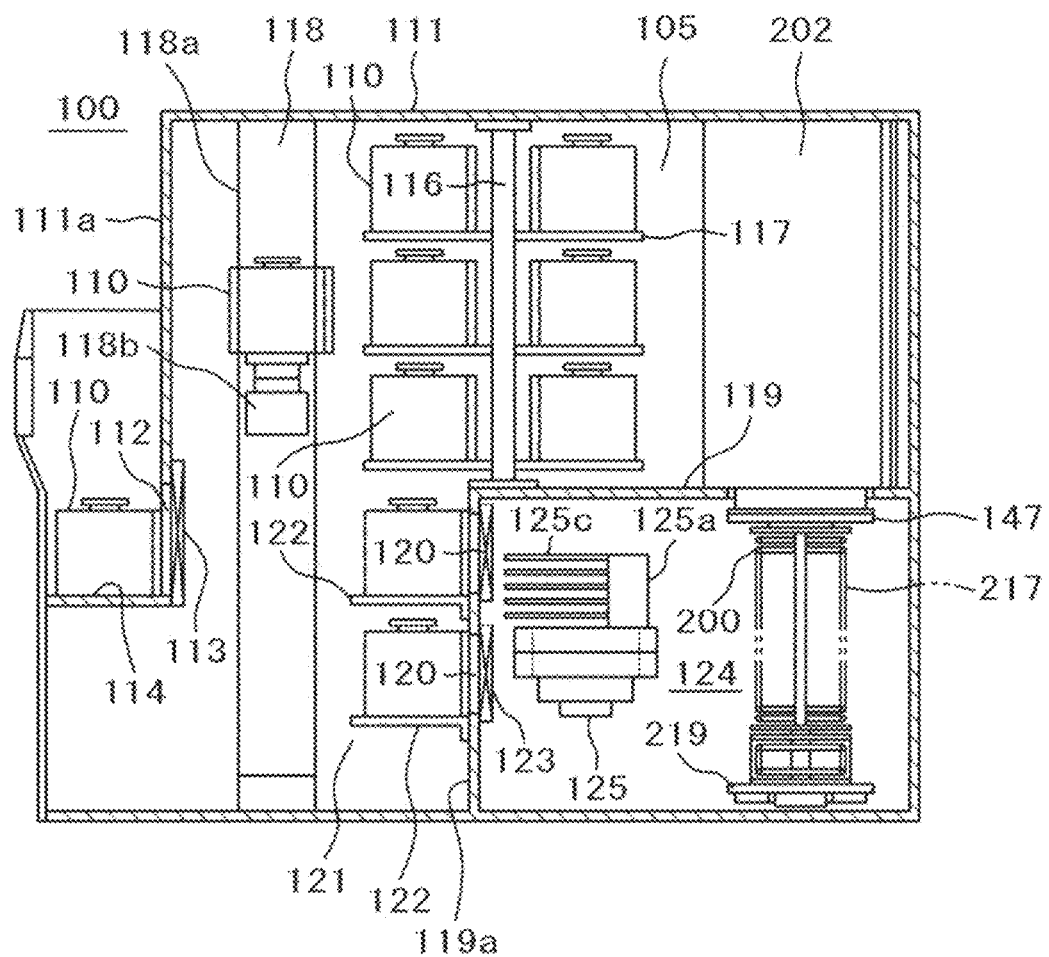
FIG. 2 is a side perspective view of the substrate processing apparatus according to the embodiment of the present disclosure.

As shown in FIGS. 1 and 2, the substrate processing apparatus 100 according to the present embodiment includes a housing 111 for performing a plurality of manufacturing processes on a wafer by using a pod 110 as a wafer carrier for accommodating wafers (substrates) 200 made of silicon or the like. A pod loading/unloading port 112 is provided on a front wall 111a of the housing 111 to bring the inside and the outside of the housing 111 into communication with each other, and the pod loading/unloading port 112 is opened and closed by a front shutter 113. A load port 114 is installed on the front side of the pod loading/unloading port 112, and the pod 110 is placed on the load port 114. The pod 110 is loaded onto the load port 114 and unloaded from the load port 114 by an in-process transfer device (not shown).

A rotary shelf 105 is installed in a front-rear direction at a substantially central upper portion inside the housing 111, and the rotary shelf 105 rotates around a support column 116 illustrated in FIG. 2 and stores a plurality of pods 110 on shelf plates 117. A pod transfer device 118 is installed between the load port 114 and the rotary shelf 105 inside the housing 111 shown in FIG. 2. The pod transfer device 118 includes a pod elevator 118a configured to be movable up and down while holding the pod 110 and a pod transfer mechanism 118b as a horizontal transfer mechanism, and transfers the pod 110 between the load port 114, the rotary shelf 105, and a pod opener 121.

As shown in FIG. 2, a sub-housing 119 is provided in the front-rear direction over a rear end portion at a substantially central lower portion inside the housing 111. On a front wall 119a of the sub-housing 119, a pair of wafer loading/unloading ports 120 for loading and unloading the wafer 200 into and out of the sub-housing 119 is provided so as to be arranged vertically in two upper and lower stages. A pair of pod openers 121 is installed at the upper and lower wafer loading/unloading ports 120, respectively. The pod opener 121 includes a mounting table 122 configured to mount the pod 110 thereon, and a cap attachment/detachment mechanism 123 configured to attach and detach a cap (lid) of the pod 110. The pod opener 121 opens and closes a wafer loading/unloading port of the pod 110 mounted on the mounting table 122 by using the cap attachment/detachment mechanism 123 to attach and detach the cap of the pod 110. The mounting table 122 is a transfer shelf on which a substrate container is mounted when the substrate is transferred.

As shown in FIG. 2, the sub-housing 119 constitutes a transfer chamber 124 isolated from an atmosphere of a space in which the pod transfer device 118 and the rotary shelf 105 are installed. A wafer transfer mechanism 125 is installed in a front region of the transfer chamber 124. The wafer transfer mechanism 125 includes a wafer transfer device 125a capable of holding the wafer 200 on tweezers 125c and horizontally rotating or linearly moving the wafer 200, and a wafer transfer device elevator 125b for raising and lowering the wafer transfer device 125a. The wafer 200 is charged and discharged into and out of a boat 217 as a substrate holder by the consecutive operations of the wafer transfer device elevator 125b and the wafer transfer device 125a.

As shown in FIG. 1, a cleaning unit 134 including a supply fan and a dustproof filter is installed in the transfer chamber 124 so as to supply a clean atmosphere or a clean air 133 which is an inert gas. As shown in FIG. 2, a process furnace 202 is provided above the boat 217. The process furnace 202 is provided with a process chamber inside the process furnace 202. A heater (not shown) for heating the process chamber is provided around the process chamber. A lower end opening of the process furnace 202 is opened and closed by a furnace opening gate valve 147.

As shown in FIG. 1, a boat elevator 115 for raising and lowering the boat 217 is installed. A seal cap 219 is horizontally installed on an arm 128 connected to the boat elevator 115. The seal cap 219 is configured to vertically support the boat 217 and to close the lower end opening of the process furnace 202. The boat 217 is provided with a plurality of holder, and is configured to horizontally hold a plurality of wafers 200 (e.g., about 50 to 175 wafers) in a vertically arranged state with their centers aligned with each other.

Figure 3:
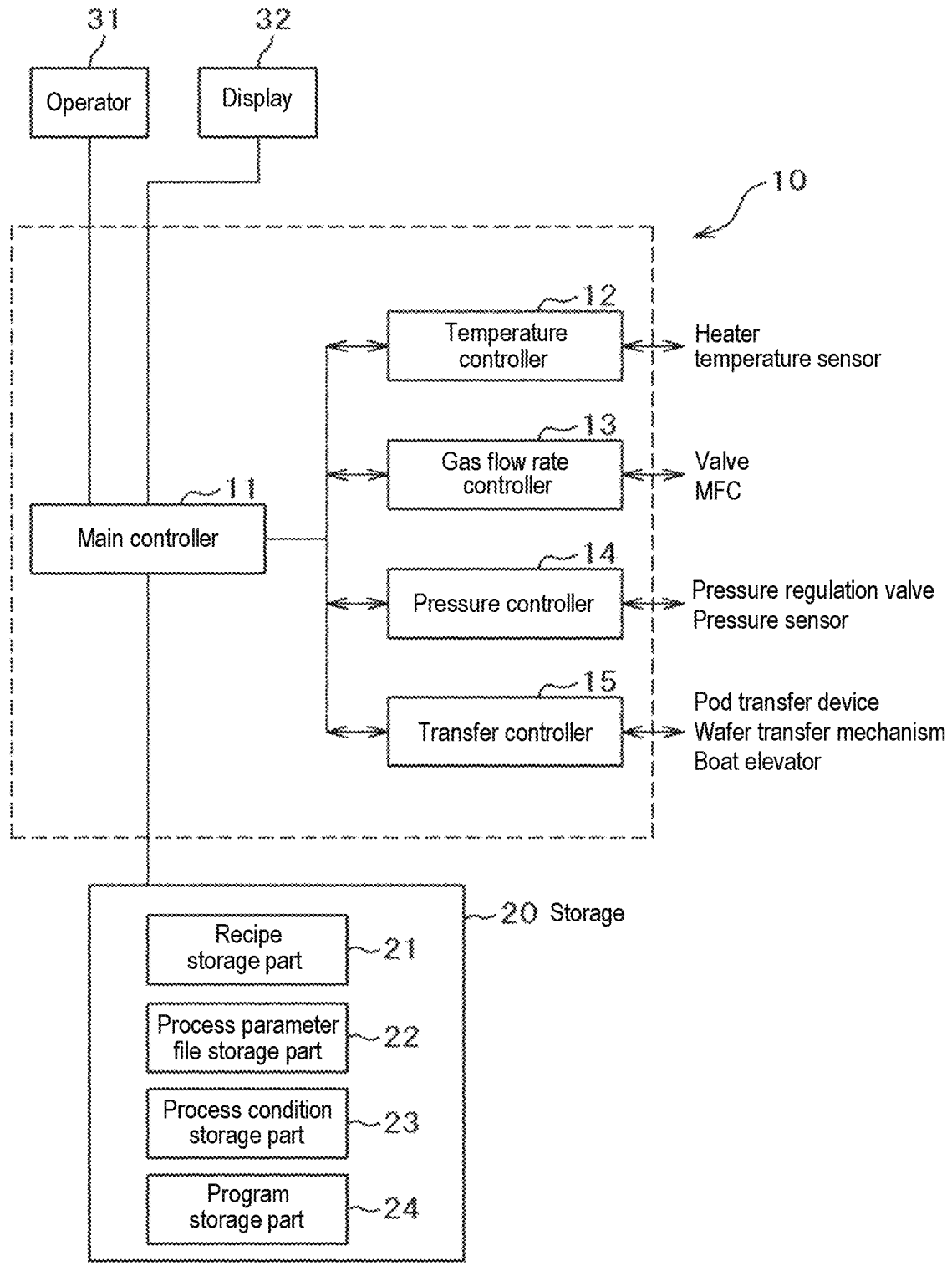
FIG. 3 shows a configuration example of a controller and a storage of the substrate processing apparatus according to the embodiment of the present disclosure.

Next, configurations of a controller and a storage of the substrate processing apparatus are described with reference to FIG. 3. As shown in FIG. 3, a controller 10 includes a main controller 11, a temperature controller 12, a gas flow rate controller 13, a pressure controller 14, and a transfer controller 15. The parts constituting the substrate processing apparatus 100, such as the temperature controller 12, the gas flow rate controller 13, the pressure controller 14, the transfer controller 15, an operator 31 for receiving instructions from an operation person, a display 32 for displaying information such as an operation screen and various data, a storage 20 for storing a recipe which is a substrate processing sequence of the substrate processing apparatus 100, and the like are electrically connected to the main controller 11. For example, in the case of a touch panel or the like, the operator 31 and the display 32 may be integrally implemented.

The main controller 11 includes, as hardware configurations, a CPU (Central Processing Unit) and a memory for storing an operation program for the main controller 11. The CPU is operated to download the file stored in the storage 20 to the memory and to execute the filet according to this operation program, for example, based on the operation person's instruction from the operator 31. In this operation, the main controller 11 causes each of the sub-control parts such as the temperature controller 12, the gas flow rate controller 13, the pressure controller 14, and the transfer controller 15 to measure the temperature and the pressure in the process chamber, the gas flow rate, and the like. Based on this measurement data, the main controller 11 outputs a control signal to each of the sub-control parts to control each of the sub-control parts so as to operate according to the recipe file in which the recipe is recorded.

The controller 10, the operator 31, the display 32, and the storage 20 do not have to be dedicated to the substrate processing apparatus, and may be implemented by using a general computer system such as a personal computer or the like. For example, a controller, an operator, a display part, and a storage for executing the aforementioned process may be implemented by installing a program for executing the aforementioned process in a general-purpose computer from a predetermined recording medium (a CD-ROM, a USB memory, or the like) that stores the program.

Further, an implementation for supplying the program for executing the aforementioned process may be appropriately selected. In addition to supplying the program via the predetermined recording medium as described above, the program may be supplied, for example, via a communication line, a communication network, a communication system, or the like. In this case, for example, the program may be posted on a bulletin board of a communication network and may be supplied via the network. Then, by starting the program provided in this way and executing the program in the same manner as other application programs under the control of the OS (Operating System) of the substrate processing apparatus, it is possible to execute the aforementioned process.

The storage 20 is an auxiliary storage device that may be composed of an EEPROM, a flash memory, a hard disk or the like, and also includes a storage medium for storing an operation program of a CPU and a storage medium for storing a recipe. The operation program stored in the storage 20 is transmitted to the memory (main storage device) of the main controller 11 and executed, for example, when the substrate processing apparatus is started up.

As shown in FIG. 3, the storage 20 includes a recipe storage part 21, a process parameter file storage part 22, a process condition storage part 23, and a program storage part 24.

The recipe storage part 21 stores a recipe for processing a substrate and a file (e.g., a combination file) related to the recipe. In addition, one recipe is usually composed of a series of steps included in a substrate processing process, and each step includes a plurality of parameters for performing the substrate processing process. For example, in the first step, the substrate processing apparatus 100 mounts a plurality of product substrates on the boat 217 and loads the boat 217 into the process furnace 202. In the next step, the substrate processing apparatus 100 processes the plurality of product substrates in the process furnace 202. In the subsequent step, the substrate processing apparatus 100 unloads the boat 217 from the process furnace 202. In the final step, the substrate processing apparatus 100 takes out the plurality of product substrates from the boat 217. In these series of steps, by executing the recipe, the substrate processing apparatus 100 is operated according to the parameters. The parameters include process parameters for processing the substrate and transfer parameters for transferring the substrate. Hereinafter, when the process parameters and the transfer parameters are not distinguished, they are simply referred to as parameters.

Further, the process parameter file storage part 22 is configured to store a combination file in which externally-defined execution conditions such as a sub-recipe, an alarm condition table, a temperature compensation table and the like are combined with the recipe.

Further, the process condition storage part 23 stores, as process condition management information, process conditions such as the number of product substrates mounted on the boat 217, a cumulative thickness of a film deposited on the boat 217, a furnace wall of the processing furnace 202 and dummy substrates, and the like. For example, the operation person may input and set this process condition management information from the operator 31.

In addition, the program storage part 24 stores program files of various programs (a recipe editing sequence and a recipe saving sequence) related to the recipe creation program described later, various programs (a recipe check sequence and a recipe execution sequence) related to the recipe execution program, and the like, or various screen files for displaying a recipe editing screen, a main menu screen, and the like on the display.

Figure 4:
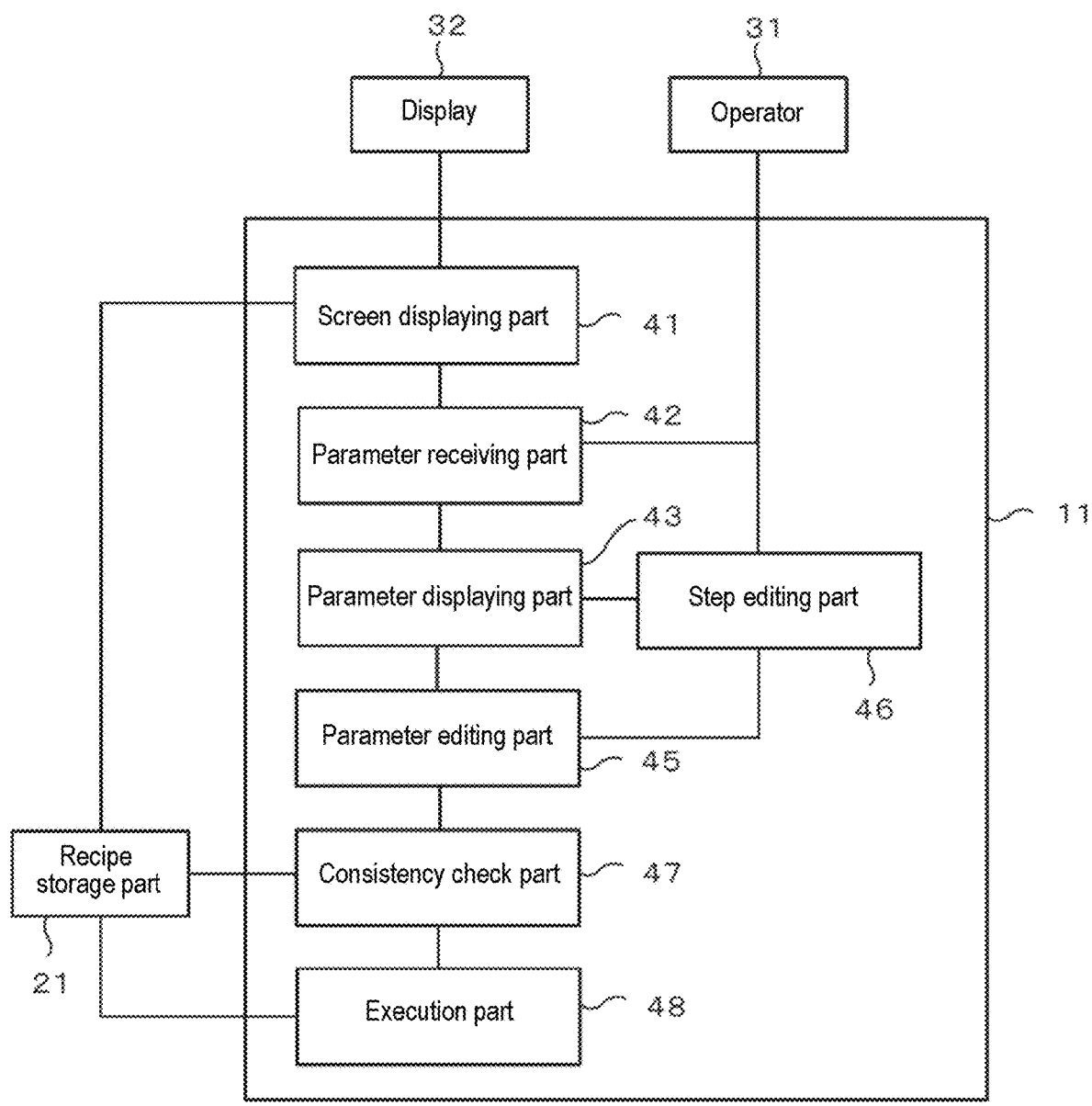
FIG. 4 is a block diagram showing a function of the controller of the substrate processing apparatus according to the embodiment of the present disclosure.

In the present embodiment, for example, when the substrate processing apparatus 100 is started up, the recipe creation program is started so that as shown in FIG. 4, the main controller 11 functions as a screen displaying part 41, a parameter receiving part 42, a parameter displaying part 43, a parameter editing part 45, a step editing part 46, and a consistency check part 47.

Next, a flow of a recipe editing process is described with reference to flow charts of FIGS. 5A to 5C and display screen examples of the display 32 of FIGS. 6 to 12D. In the following, a case where the operator 31 and the display 32 are integrated into a touch panel will be described by way of example.

First, the entire flow of the recipe editing process is described with reference to the flow chart of FIG. 5A. As the apparatus is started up, a main menu screen is displayed on the display 32. For example, when a recipe editing button is selected on the main menu screen to create a recipe, a list screen of recipe files (not shown) in which recipes are recorded is opened (step S1). When a target recipe file to be subjected to recipe creation is selected on this list screen (step S2), the screen displaying part 41 is configured to display contents of the target recipe file on a recipe editing screen 2001 (step S3). As for the recipe files for each substrate processing apparatus, recipe files that have been used in the past are stored in the storage 20 in advance. Alternatively, recipe files stored in another host computer or another substrate processing apparatus may be copied and stored in the storage 20.

The screen displaying part 41 displays the recipe editing screen 2001 shown in FIG. 6. The recipe editing screen 2001 shown in FIG. 6 is configured to include a step editing screen area A for editing steps that constitute a recipe to be edited, a selection screen area B for selecting parameters related to substrate processing and parameters related to substrate transfer, and a parameter editing screen area C for editing the selected parameters. When the recipe editing screen 2001 is displayed, the step editing area A displays a series of steps performed in the substrate processing according to the target recipe file.

An example of the step editing area A shown in FIG. 6 is described in relation to the substrate processing of the substrate processing apparatus shown in FIG. 1. "B. LOAD" indicates a boat loading step in which the boat 217 holding the wafers mounted thereon is loaded into the process furnace 202. "RAMP ON" indicates a ramp-up step of raising the temperature in the process furnace 202, "DEPO" indicates a film-forming step, and "RAMP OFF" indicates a ramp-down step of lowering the temperature in the process furnace 202. Further, "ROTATE STOP" indicates a rotation stop step of stopping the rotation of the boat 217. "B. UNLD" indicates a boat unloading step of unloading the boat 217 that holds the processed wafers mounted thereon from the process furnace 202. Although not shown in FIG. 6, as another step, there is a "PURG" step (purge step) of converting an internal atmosphere of the process furnace 202 into an inert gas atmosphere before film formation. These steps are examples, and each step used for substrate processing is displayed in the step editing area A.

Further, the steps displayed in the step editing area A may be edited by adding or deleting a step according to the substrate processing. A detailed method of editing the step editing area A will be described later.

Next, the parameter receiving part 42 receives, from the operator 31, a selection operation for selecting an editing target parameter from a parameter list displayed in the selection screen area B (step S4). For example, in the operator 31, a pointing device or a touch panel is operated to select a plurality of editing target parameters from a parameter list displayed in the selection screen area B shown in FIG. 6. Further, in the parameter editing screen area C, setting icons 2005, 2006 and 2007 for setting timing charts T of the selected editing target parameters are displayed.

An example of the method of selecting the editing target parameters from the parameter list displayed in the selection screen area B is described with reference to FIGS. 11A, 11B, 11C, and 11D.

As shown in FIGS. 11A, 11B, 11C, and 11D, in the selection screen area B, for example, the names representing the same type of parameters such as temperature setting or mass flow controller (MFC) are displayed as item names (e.g., "Temperature", "MFC" and the like in FIG. 11A), and detailed parameter names (e.g., "Ch1", "Ch2" and the like in FIG. 11B) are displayed in the hierarchy below the respective item names. The item names with the mark "+" indicate collections of multiple parameter names. The hidden parameter names can be expanded by touching them. When the hidden parameter names are expanded, the display of the mark "+" is switched to the display of the mark "−".

The parameter displaying part 43 displays an icon for setting a timing chart corresponding to each parameter described later in the parameter editing screen area C in an editable manner in order to edit the editing target parameters selected by the selection operation (step S5).

Figure 11A:
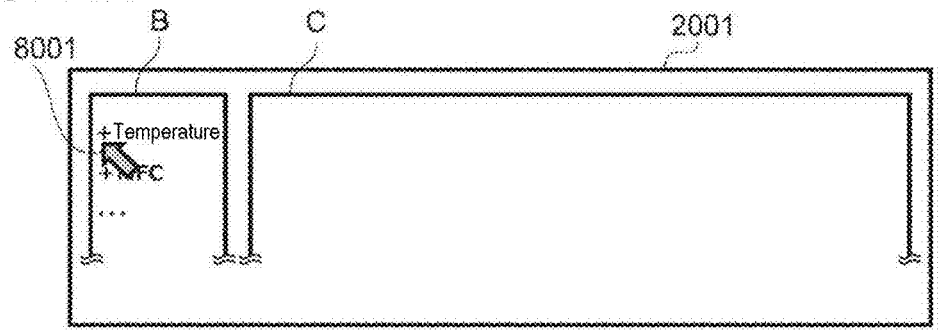
FIGS. 11A, 11B, 11C, and 11D are a diagram for explaining the relationship between a selection screen area and a parameter editing screen area according to the embodiment of the present disclosure.
Figure 11B:
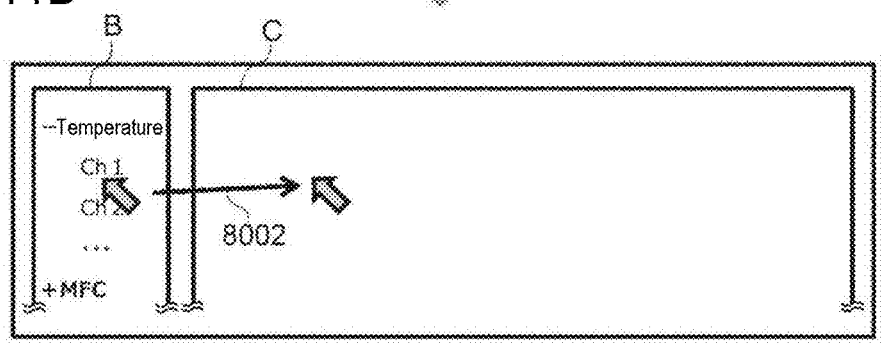
Figure 11C:
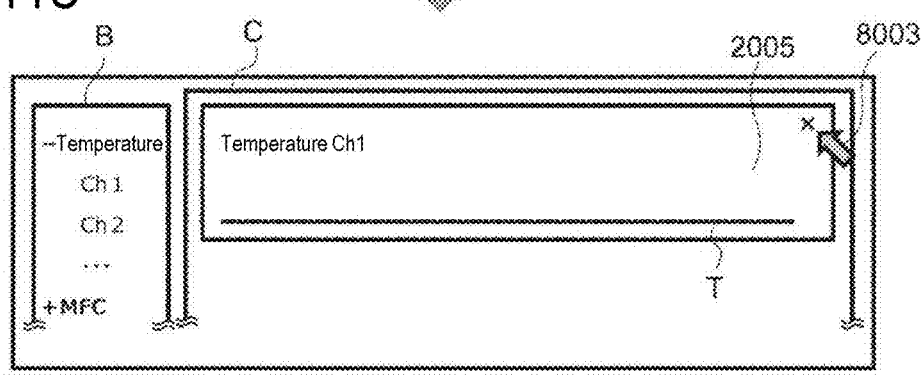

If an editing target parameter is added to the parameter editing screen area C by performing an operation 8001 of selecting the editing target parameter from each parameter list in the selection screen area B on the left side of the screen as shown in FIG. 11A, and performing an operation 8002 of dragging and dropping the editing target parameter as shown in FIG. 11B, a setting icon 2005 for setting a timing chart T of the added parameter "temperature Ch1" is displayed in the parameter editing screen area C as shown in FIG. 11C. This example is directed to a "Temperature" setting icon 2005.

The timing chart T indicates a time-dependent change of each of a series of steps included in a substrate processing process. For example, as shown in FIG. 6, the time at the boundary of each step in the step editing area A is displayed so as to correspond to the change in the timing chart T displayed in the parameter editing screen area C. The parameter can be edited by editing each displayed timing chart T.

The parameters include a parameter indicating a set value (analog value) such as, for example, a temperature set value, a flow rate set value or the like, for setting a target value targeted by the substrate processing performed in the substrate processing apparatus device; a parameter indicating a set value (digital value) such as, for example, opening/closing of a valve or the like, for turning on or off a state of a part of the substrate processing apparatus; and a parameter indicating a set value (command value) of a transfer process for outputting a transfer control command that controls a transfer process for controlling, for example, the operation of the boat 217 to the transfer controller 15. Moreover, setting icons for setting individual parameters described later are defined. In addition, the parameter indicating the target value includes a time for setting the target value, the parameter for turning on or off the state of the part includes a time for switching the state of the part on and off, and the parameter of the transfer process includes a time for outputting the transfer control command for each transfer process.

The setting icon 2005 shown in FIG. 6 represents an analog value timing chart T indicating a change in the target value of each step, the setting icon 2006 represents a digital value timing chart T indicating whether the state of the part is on or off at each step, and the setting icon 2007 represents a command value timing chart T indicating which transfer process is performed in each step. Further, by horizontally scrolling a scroll bar 2004 located below the parameter editing screen area C in FIG. 6, it is possible to continuously check the change in the timing charts T located outside the displayed screen. In addition, by vertically scrolling a scroll bar 2003 located on the right side of the parameter editing screen area C, it is also possible to check the setting icons 2005, 2006, and 2007 (or the timing chart T in each icon) located outside the displayed screen.

The display method of the present disclosure may display parameters of steps included in the substrate processing process in the format of a timing chart T on the recipe editing screen 2001 instead of an editing screen for directly editing numerical values such as a temperature, a flow rate, and the like on a step-by-step basis. This makes it possible to check the timing at which each parameter of the entire recipe is changed by comparing it with the timing of changes in other parameters, and this makes it possible to perform the editing operation while grasping the flow of the parameters. Further, the work of checking the recipe while considering the numerical values before and after a step may be avoidable, and it is possible to intuitively check the recipe by seeing the timing chart T. Therefore, it is possible to expect shortening a recipe check time.

Figure 5A:
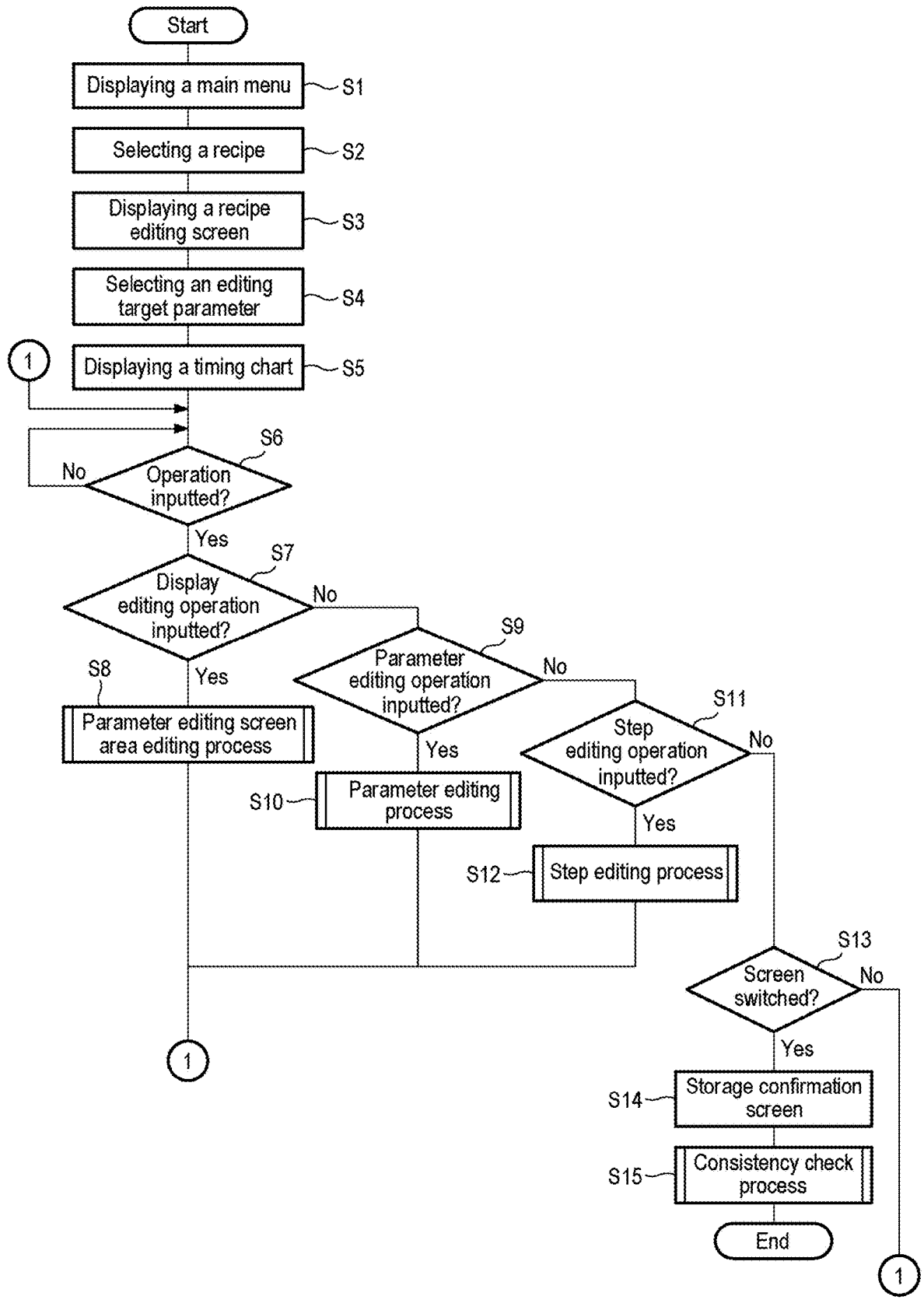
FIG. 5A is a main flow chart of recipe editing according to the embodiment of the present disclosure.
Figure 5B:
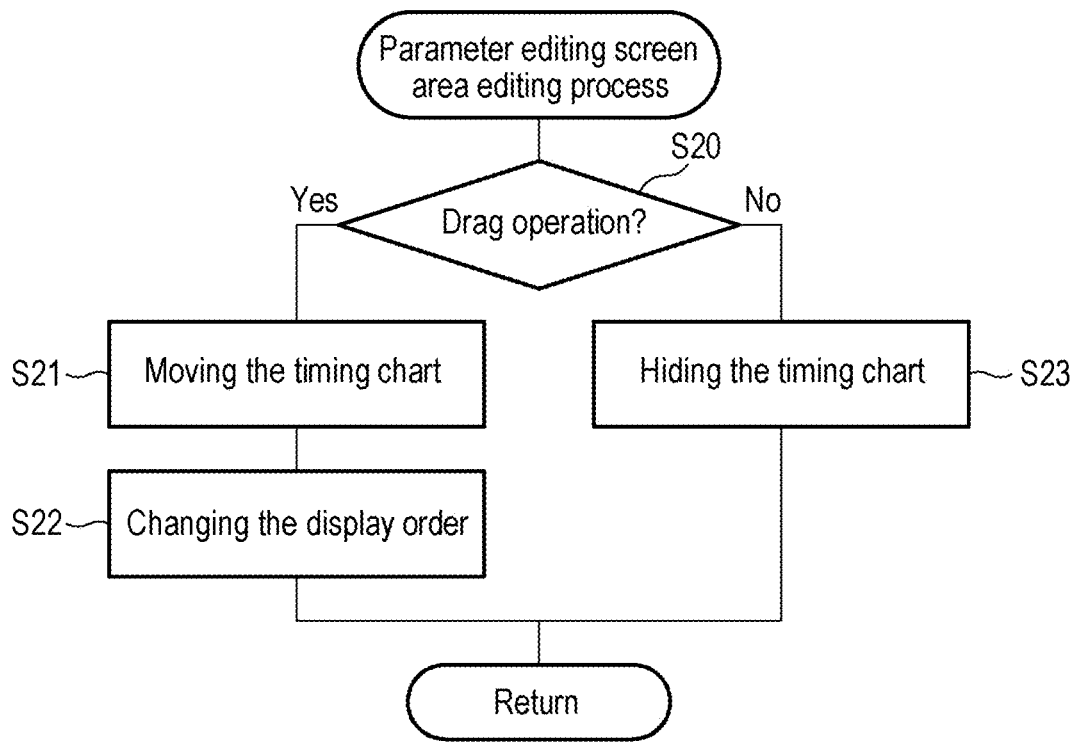
FIG. 5B is a flow chart for explaining a change in displaying a timing chart on a recipe editing screen according to the embodiment of the present disclosure.

As shown in FIG. 5A, when the parameter editing screen area C is displayed, the process subsequently waits for the input of an operation instruction for editing the recipe (step S6).

In the parameter editing screen area C, the timing charts T of the editing target parameters are displayed in the setting icons 2005, 2006, and 2007 in the order in which the parameters are selected. When editing the recipe, in order to facilitate comparison between the parameters selected as editing targets, the operation person may display, side by side, the compared timing charts T of the parameters among the timing charts T displayed in the parameter editing screen area C, or may hide the timing charts T of the parameters which are not comparison targets. When such an operation instruction to change the display order of the timing charts T or to hide the timing charts T is given from the operator 31 (when the determinations in steps S6 and S7 are "Yes"), a parameter editing screen area editing process is executed (step S8). In the parameter editing screen area editing process, the parameter displaying part 43 changes the display of the parameter editing screen area C according to the operation instruction.

Further, the parameter editing part 45 receives an operation instruction to edit the timing charts T displayed in the parameter editing screen area C from the operator 31, and edits the timing charts T. That is, when it is determined that the operation instruction is a parameter editing operation input (when the determination in step S9 is "Yes"), a parameter editing process is executed (step S10). When it is determined that the operation instruction is a step editing operation input (when the determination in step S11 is "Yes"), a step editing process is executed (step S12).

The parameter editing screen area editing process (step S8) is described with reference to a flow chart of FIG. 5B. When an operation instruction to change the display order of the timing charts T displayed in the parameter editing screen area C is given, the parameter displaying part 43 changes the display order of the timing charts T according to the operation instruction. For example, if a point in the setting icon 2006 indicating a timing chart T of "Valve Ch1" in FIG. 6 is dragged upward while it is clicked (the determination in step S20 is "Yes"), the timing chart T of "Valve Ch1" is moved (step S21) and may be displayed above the timing chart T of "MFC Ch1" (step S22).

Figure 11D:
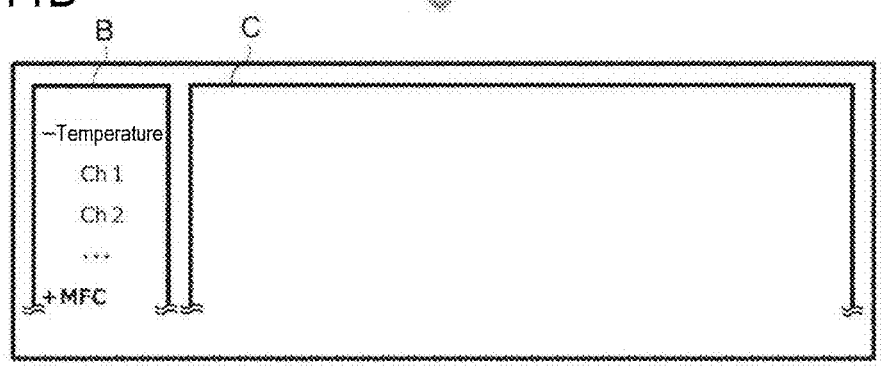

Further, when an operation instruction to hide a timing chart T displayed in the parameter editing screen area C is given, the parameter displaying part 43 hides the timing chart T for which the operation instruction is given. For example, when an operation 8003 of clicking a close mark "x" in the area where the timing chart T of "Temperature Ch1" in FIG. 11C is displayed is performed (when the determination in step S20 is "No"), the setting icon 2005 of the timing chart T of "Temperature Ch1" is hidden as shown in FIG. 11D (step S23).

By giving such an operation instruction, related timing charts T can be displayed side by side, or a certain timing chart T can be hidden, which makes it easy to find the regions to be edited. When the parameter editing screen area editing process is completed, the process returns to step S6 of the flow chart of FIG. 5A, and waits again for the input of an operation instruction.

Next, a parameter editing process (step S10) for editing the timing chart T displayed in the parameter editing screen area C and editing the parameters corresponding to the timing chart T is described. When one of the timing charts T of the setting icons 2005, 2006, and 2007 in the parameter editing screen area C of FIG. 6 is touched, it is determined that an operation instruction for a parameter editing process is given (the determination in step S6 is Yes," the determination in step S7 is "No," and the determination in step S9 is "Yes). Thus, a parameter editing process is executed (step S10). In the parameter editing process, the parameter editing part 45 performs processing according to the operation instruction.

The parameter editing part 45 changes the timing chart T in response to an operation instruction to move a point on the timing chart T displayed in the parameter editing screen area C. Further, the parameter editing part 45 edits the parameters corresponding to the changed timing chart T according to the change in the timing chart T.

(Editing Parameter of Target Value)

By using a flow chart of FIG. 5C and display screens of FIGS. 7A to 7C, description will be made on a case where an operation instruction to move a point on the timing chart T indicating a change in an analog value such as a target value or the like is given.

Figure 7A:
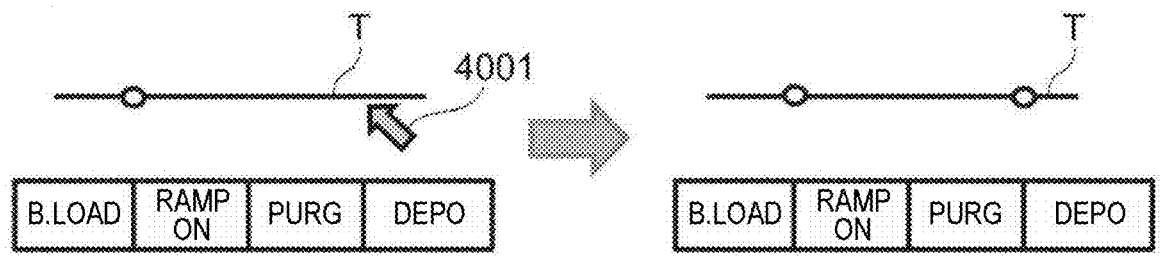
FIG. 7A is a diagram showing an example of a display screen for explaining an editing operation of a timing chart indicating a target value according to the embodiment of the present disclosure.
Figure 7B:
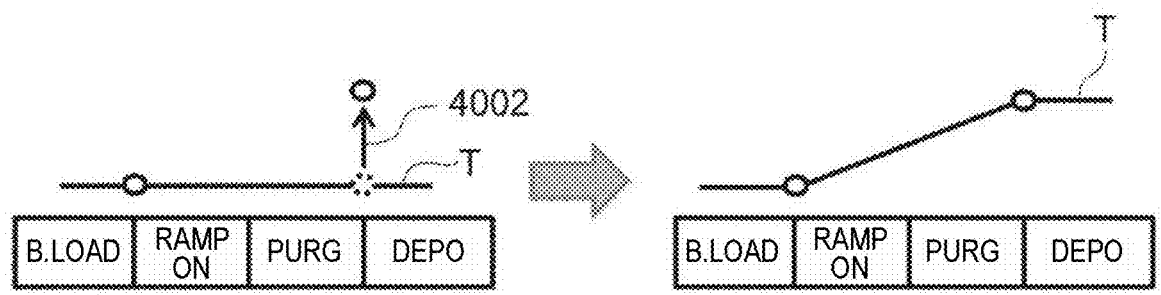
FIG. 7B is a diagram showing another example of a display screen for explaining an editing operation of a timing chart indicating a target value according to the embodiment of the present disclosure.
Figure 7C:
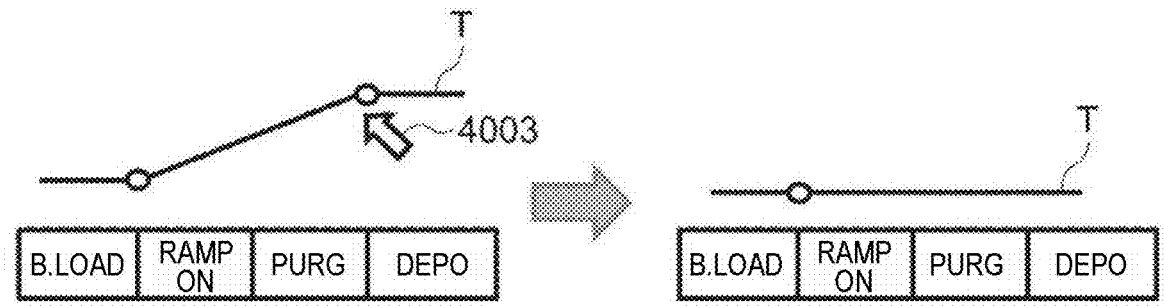
FIG. 7C is a diagram showing still another example of a display screen for explaining an editing operation of a timing chart indicating a target value according to the embodiment of the present disclosure.

As shown in FIG. 7A, when an operation 4001 of touching a line of the timing chart T indicating a target value is performed (the determination in step S30 is "Yes"), the parameter editing part 45 creates a point at a position corresponding to a start time (or end time) of a step closest to the touched location (step S31). The created point can be moved in a stepwise manner by a left/right dragging operation. A point is created by moving the created point to the start time of the step for which the target value is to be changed. Further, as shown in FIG. 7A, a point is also created at the time at which an analog value starts to be changed (the time between "B. LOAD" and "RAMP ON"). Next, as shown in FIG. 7B, when an operation 4002 of vertically dragging a point of the time at which the target value is reached is performed (step S32), the parameter editing part 45 changes the target value of the timing chart T. For example, the target value is increased by dragging the point upward, and the target value is decreased by dragging the point downward. An upper limit value and a lower limit value of such setting may be specified in advance. Further, as shown in FIG. 7C, when an operation 4003 of once-touching the point created on a graph is performed, the parameter editing part 45 deletes the point on the timing chart T.

In the foregoing, the target value is changed by moving the point on the timing chart T up and down. Alternatively, when the point is created, an input frame for inputting a target value may be displayed, and a numerical value indicating the target value at the position of the point may be inputted by using a keyboard, a numeric keypad, or the like.

Further, as for the parameter corresponding to the timing chart T for which the instruction to set a target value is given, the parameter editing part 45 keeps unchanged the target value until the time at which the value starts to be changed, and changes the target value at the time at which the target value is reached, from the target value indicated by the point before movement to the target value indicated by the point after movement (step S33).

(Editing Parameter of On/Off Switching)

Figure 5C:
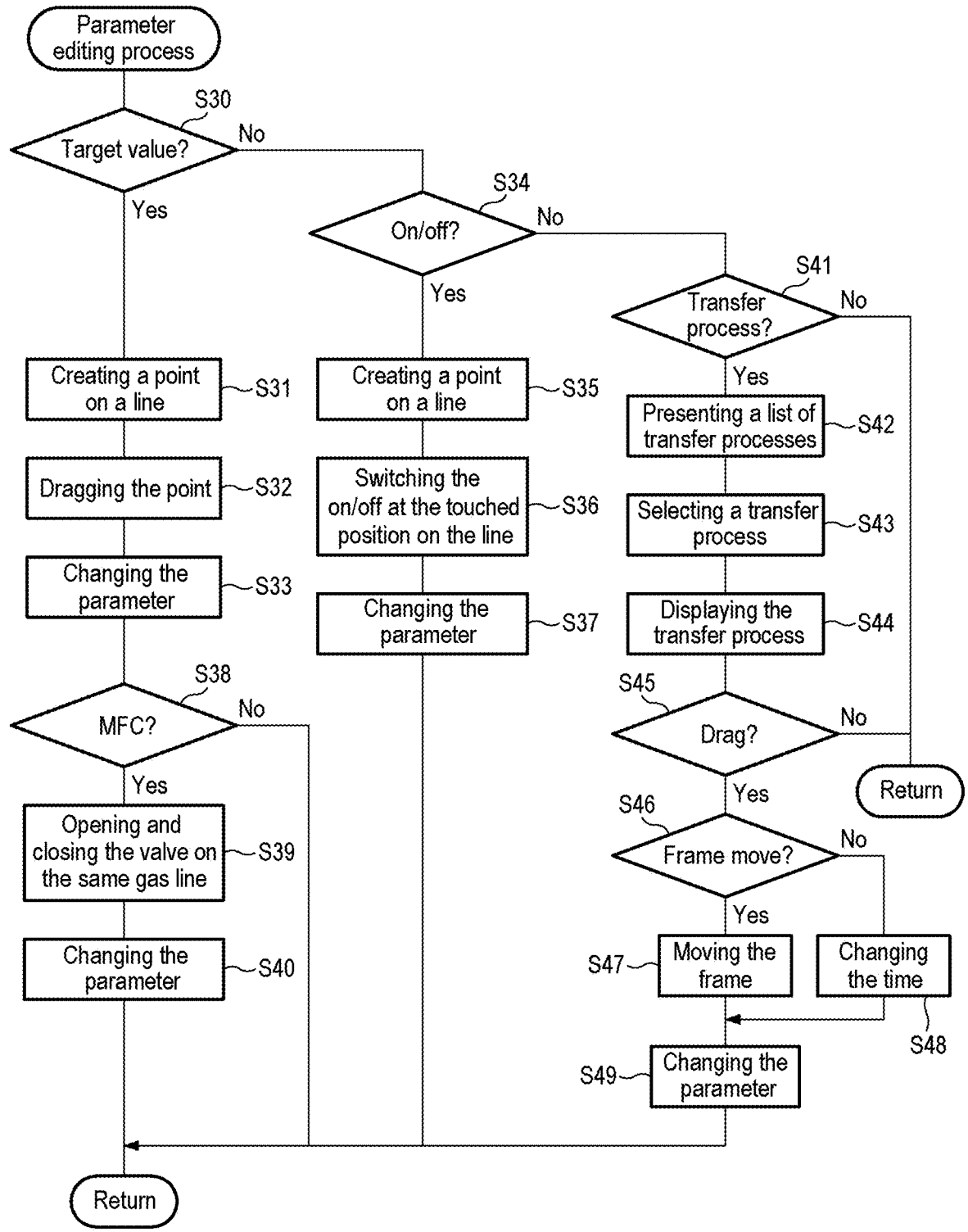
FIG. 5C is a flow chart for explaining an editing process of a timing chart according to the embodiment of the present disclosure.
Figure 8A:
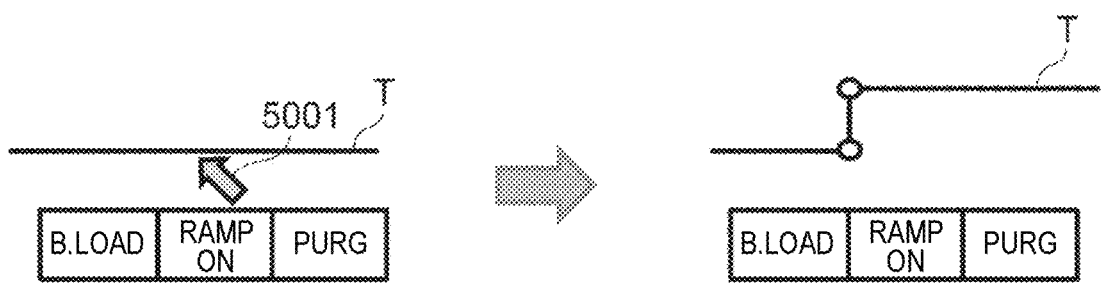
FIG. 8A is a diagram showing an example of a display screen for explaining an editing operation of a timing chart indicating an on/off state of a part according to the embodiment of the present disclosure.
Figure 8B:
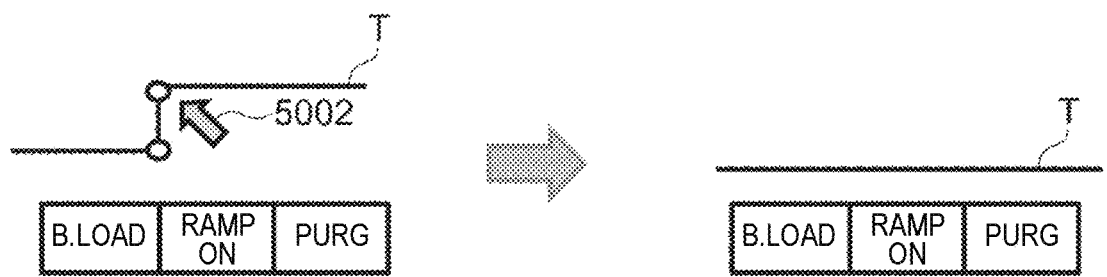
FIG. 8B is a diagram showing another example of a display screen for explaining an editing operation of a timing chart indicating an on/off state of the part according to the embodiment of the present disclosure.

Next, by using a flow chart of FIG. 5C and an example of display screens of FIGS. 8A and 8B, description is made on a case where an operation instruction of switching a digital value such as on/off of a timing chart T indicating a state of a part such as a valve or the like is given.

As shown in FIG. 8A, when an operation 5001 of once-touching a point on a line of a timing chart T indicating a state of a part is performed (the determination in step S30 is "No" and the determination in step S34 is "Yes"), the parameter editing part 45 creates a point at a position corresponding to the start time (or end time) of the step in the same manner as described above (step S35). Further, at this point, the timing chart T is switched from off to on (the timing chart T is changed to a high level) and displayed (step S36). On the other hand, as shown in FIG. 8B, when an operation 5002 of once-touching a point on the line kept in an ON state is performed (step S35), the parameter editing part 45 switches the state of the touched point on the timing chart T from on to off (the timing chart T is returned to the low level), and the point is deleted (step S36).

Further, the parameter editing part 45 changes the parameter of the timing chart T for which the on/off switching instruction is given to a value at which the on/off state is switched, at the time corresponding to the position of the indicated point (step S37).

(Editing Parameter of Mass Flow Controller)

Figure 9A:
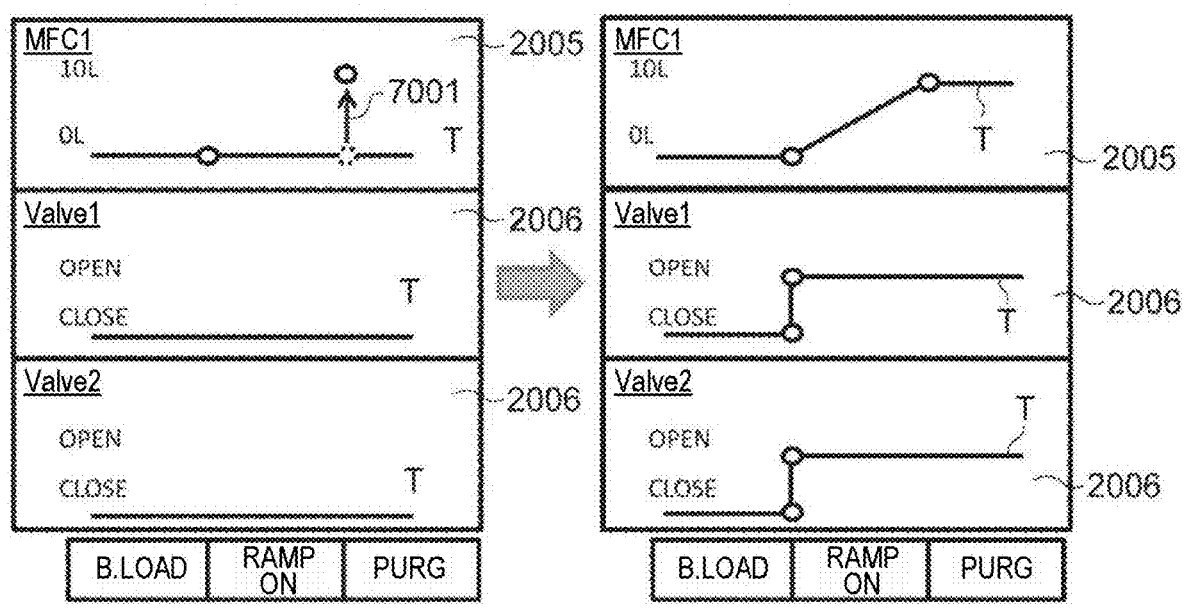
FIG. 9A is a diagram showing an example of a display screen for explaining an editing operation of a timing chart of a mass flow controller according to the embodiment of the present disclosure.
Figure 9B:
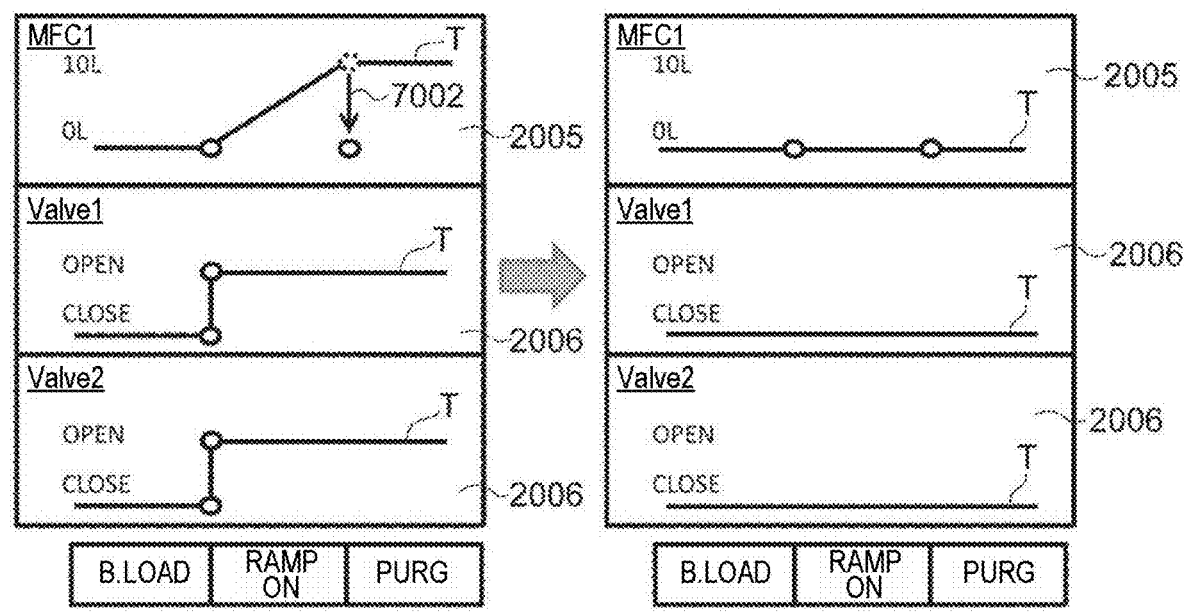
FIG. 9B is a diagram showing another example of a display screen for explaining an editing operation of a timing chart of the mass flow controller according to the embodiment of the present disclosure.
Figure 9C:
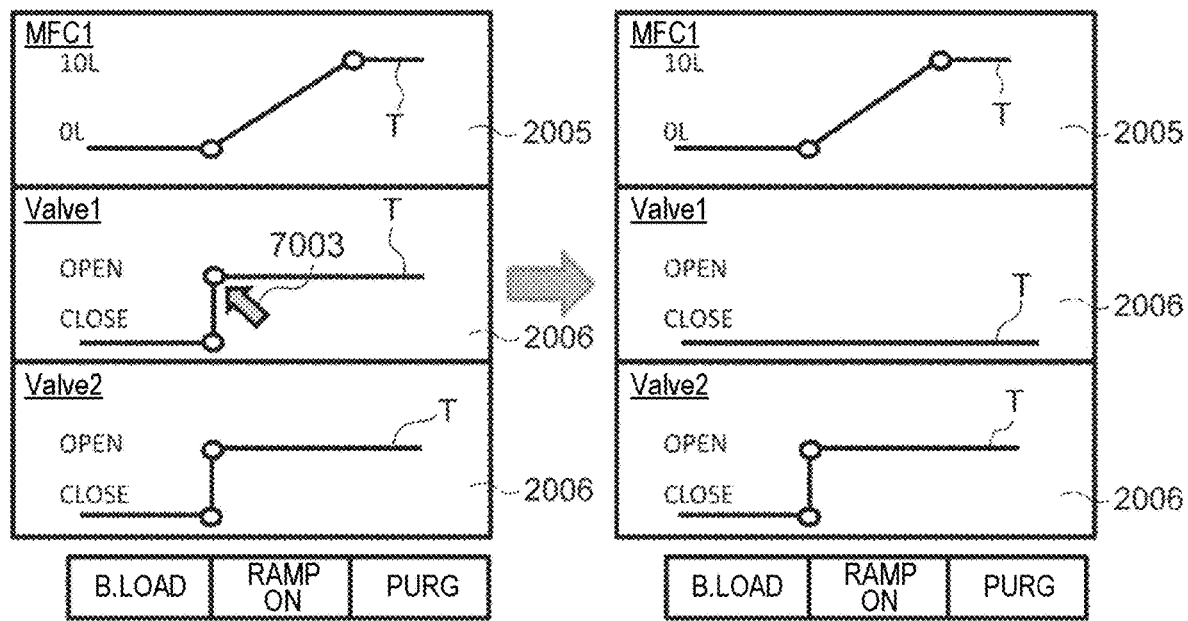
FIG. 9C is a diagram showing still another example of a display screen for explaining an editing operation of a timing chart of the mass flow controller according to the embodiment of the present disclosure.

Next, by using the flow chart of FIG. 5C and an example of display screens of FIGS. 9A to 9C, description is made on an example of a method of editing the timing chart T when a mass flow controller (MFC) and a plurality of valves exist on the same gas line. The mass flow controller and the valves existing on the same gas line set the flow rate of the mass flow controller and automatically set the on/off state of the valves. This makes it possible to prevent valve setting omissions.

In the case where a mass flow controller and a plurality of valves exist on the same gas line, when a certain mass flow controller is selected from the list of parameters displayed in the selection screen area B by the parameter receiving part 42, it is preferable that the parameter displaying part 43 automatically displays, in the parameter editing screen area C, the timing charts T of the parameters of the valves related to the selected mass flow controller as well as the timing chart T of the selected mass flow controller.

As shown in FIG. 9A, in the parameter editing screen area C, the setting icon 2005 of the parameter timing chart T for setting the flow rate of a mass flow controller MFC1 and the setting icons 2006 of the timing charts T of the valve Valve1 and the valve Valve2 provided on the same gas line are displayed.

As shown in FIG. 9A, when an operation of indicating a point on the line of the timing chart T of the mass flow controller MFC1 displayed on the parameter editing screen area C is performed (the determination in step S30 is "Yes"), the parameter editing part 45 creates, as described above, points at positions corresponding to the time at which the value starts to be changed and the time at which the target value is reached (step S31). Further, when an operation 7001 of dragging the point corresponding to the time at which the target value is reached is performed, the target value of the flow rate of the mass flow controller MFC1 is changed (step S32). The parameter editing part 45 changes the parameter of the mass flow controller MFC1 to the changed target value of the timing chart T (step S33). Since the timing chart T being edited is directed to the mass flow controller (the determination in step S38 is "Yes"), the parameter editing part 45 changes the timing charts T of the valve Valve1 and the valve Valve2 existing on the gas pipe line having the mass flow controller to an on state (open state) in an interlocking manner (step S39). The valve Valve1 and the valve Valve2 are turned on at the time at which the value of the mass flow controller MFC1 starts to be changed, i.e., at the time corresponding to the point where the value starts to rise from "0". In addition, the parameter editing part 45 also changes the parameter values of the valve Valve1 and the valve Valve2 of the changed timing chart T in conformity with the timing chart T (step S40).

On the contrary, as shown in FIG. 9B, when an operation 7002 of dragging the point on the line of the timing chart T of the mass flow controller MFC1 is performed (step S32) and when the point is moved so that the target value of the flow rate becomes "0," the parameter editing part 45 changes the timing charts T of the valve Valve1 and the valve Valve2 to an off state (closed state) in an interlocking manner (step S39). The parameter editing part 45 re-changes the parameter value of the mass flow controller MFC1 whose timing chart T has been changed and the parameter values of the valve Valve1 and the valve Valve2 (steps S33 and S40).

The inside of the mass flow controller may be evacuated during the maintenance or the like, and the valve may not be operated in conjunction with the mass flow controller MFC1. In that case, the open/closed states of the valve Valve1 and the valve Valve2 can be set individually. As shown in FIG. 9C, when an operation 7003 of touching a point on the line of the timing chart T of the valve Valve1 is performed (step S35), the parameter editing part 45 changes the timing chart T of the valve Valve1 to an off state (step S36). In addition, the parameter editing part 45 changes the parameter of the valve Valve1 whose timing chart T has been changed to an off state (step S37).

(Editing Parameter of Transfer Process)

Next, by using the flow chart of FIG. 5C and display screens of FIGS. 10A to 10C, description will be made on an example of a method of editing a timing chart T of transfer process parameters (transfer parameters). In this case, a start time or an end time of a transfer process selected from a plurality of types of transfer processes is changed in conformity with a time of each step.

First, when a transfer process is selected by the parameter receiving part 42 from the list of parameters displayed in the selection screen area B, the parameter displaying part 43 displays the setting icon 2007 of the timing chart T of the transfer process in the parameter editing screen area C. The timing chart T of the transfer process is displayed to indicate the start time and the end time of each transfer process. In addition, when the transfer process is not set in the timing chart T of the transfer process, for example, "No" indicating that the transfer process is not set is displayed.

Figure 10A:
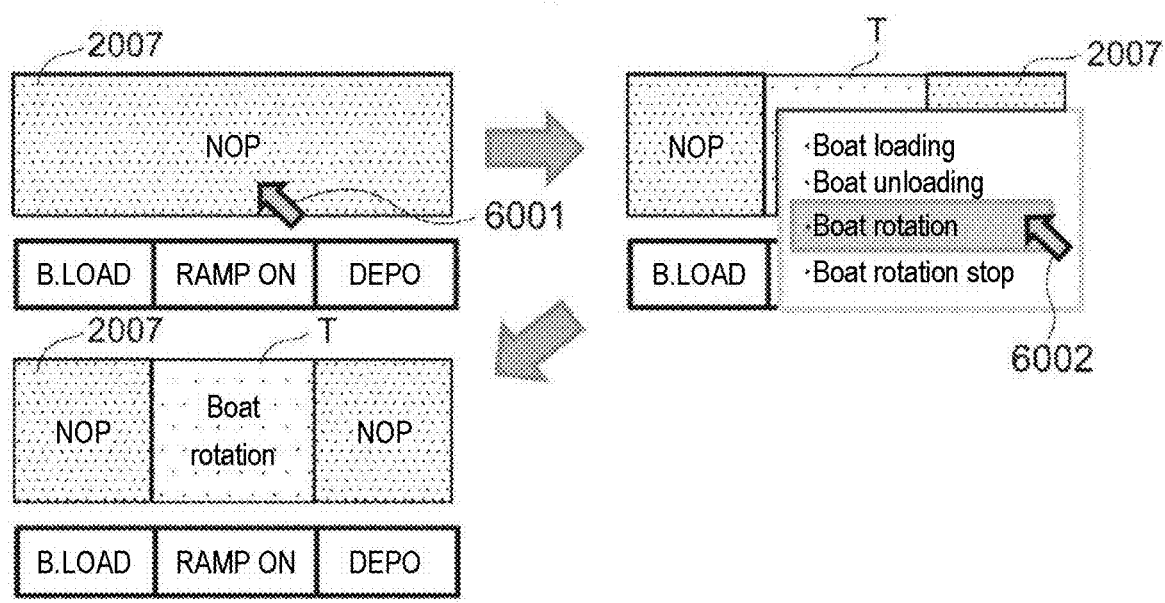
FIG. 10A is a diagram showing an example of a display screen for explaining an editing operation of a timing chart indicating a transfer process to the embodiment of the present disclosure.

As shown in FIG. 10A, when a touching operation 6001 is performed in the setting icon 2007 of the transfer process (the determinations in step S30 and step S34 are "No" and the determination in step S41 is "Yes"), the parameter editing part 45 displays a list of selectable types of transfer processes (e.g., boat loading, boat unloading, boat rotation, boat rotation stop, etc.) in the vicinity of the point where the touching operation 6001 (step S42). When an operation 6002 of selecting a target transfer process from the list of transfer processes is performed (step S43), the parameter editing part 45 displays the timing chart T of the selected transfer process "boat rotation" in conformity with the time range of the step in which the point on the setting icon 2007 exists (step S44). The left and right ends of the transfer process "boat rotation" set in the timing chart T are displayed so as to coincide with the start time and end time for the step "RAMP ON" of the manufacturing process in which the point of the touching operation 6001 exists.

Figure 10B:
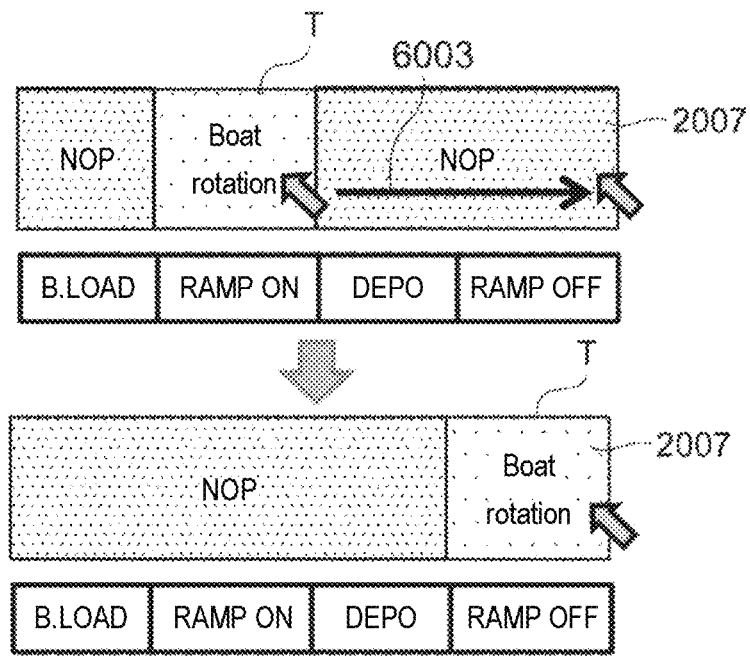
FIG. 10B is a diagram showing another example of a display screen for explaining an editing operation of a timing chart indicating the transfer process according to the embodiment of the present disclosure.

Further, as shown in FIG. 10B, when lateral drag is performed in a state in which a point in the transfer process "boat rotation" set in the timing chart T is selected (the determination in step S45 is "Yes"), it is determined that an instruction is made to move the frame of the transfer process "boat rotation" (the determination in step S46 is "Yes"). When the operation 6003 of dragging the frame of the transfer process "boat rotation" to the right is performed, the parameter editing part 45 moves the left and right ends of the transfer process "boat rotation" to coincide with the start time and end time of the steps "RAMP OFF" in the region where the dragged point exists (step S47).

Figure 10C:
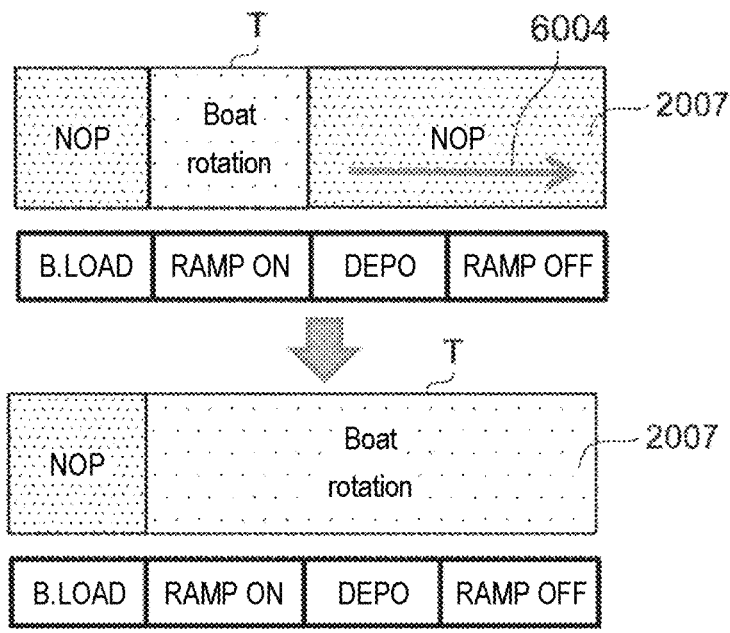
FIG. 10C is a diagram showing still another example of a display screen for explaining an editing of a timing chart indicating the transfer process according to the embodiment of the present disclosure.

Further, as shown in FIG. 10C, when an operation 6004 of selecting and dragging either the start time (left end) or the end time (right end) of the frame of the transfer process set in the timing chart T is performed, it is determined that the time is changed (the determination in step S45 is "Yes" and the determination in step S46 is "No"). The parameter editing part 45 extends or shortens the time range in which the transfer process is executed (step S48). In the example of FIG. 10C, the parameter editing part 45 extends the end time at the right end of the transfer "boat rotation" to the end time of the manufacturing process "RAMP OFF".

Further, the parameter editing part 45 changes the transfer control parameter so that a transfer control command corresponding to each transfer process is outputted to the transfer controller 15 according to the start time (left end) and end time (right end) of the frame of each transfer process set in the timing chart T and so that the transfer control command is outputted to the transfer controller 15 in conformity with the time at which each transfer process is set (step S49).

(Transfer Limiting Function During Boat Rotation)

There is provided a transfer limiting function during boat rotation that limits operations such as the vertical movement of the mechanism supporting the boat 217 or the like while the boat 217 is rotating. It is assumed that while editing the transfer process, for example, a transfer process for moving the boat 217 from the process furnace to the transfer chamber in a certain step is selected. When the transfer process is changed in the parameter editing part 45 to change the parameter in conformity with the timing chart T of the transfer process, a program for checking the consistency of the recipe is started. If the process goes back from the step in which the transfer process is changed by the consistency check program to the previous step and if the "boat rotation" command is detected before the "boat rotation stop" command, a warning is issued on the display screen.

When the editing process of each parameter is completed, the process returns to step S6 of the flow chart of FIG. 5A, and waits again for the input of an operation instruction.

(Editing of Step)

Next, the editing of the step editing area A will be described. When an operation instruction to change a step in the step editing area A is inputted (the determination in step S6 is "Yes," the determination in steps S7 and S9 are "No," and the determination in step S11 is "Yes"), a step editing process is executed (step S12). In the step editing process, the step editing part 46 performs processing according to the operation instruction.

The step editing part 46 edits the step editing area A by adding a new step before or after any step in the series of steps, or deleting any step in the series of steps.

Figure 5D:
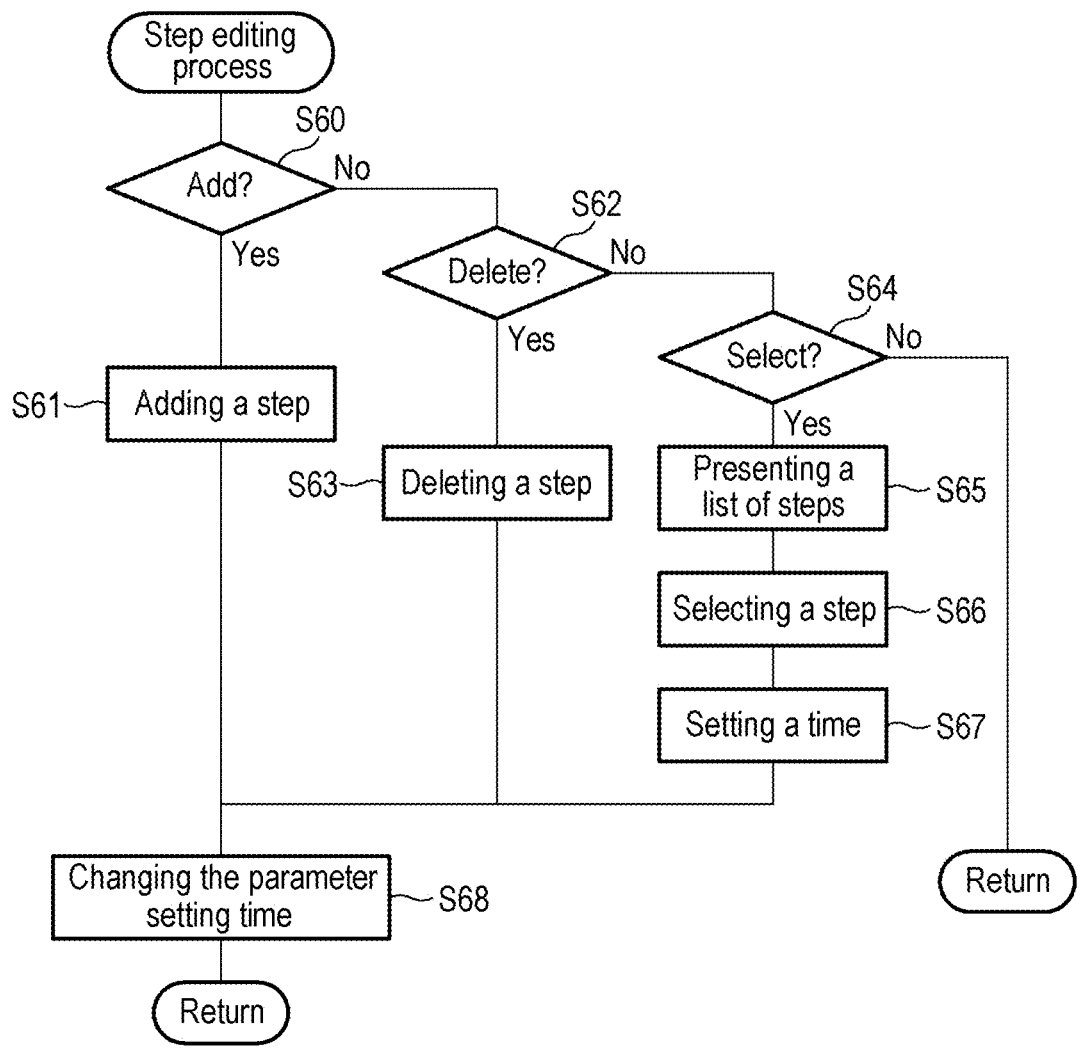
FIG. 5D is a flow chart for explaining a step editing process on the recipe editing screen according to the embodiment of the present disclosure.
Figure 12A:
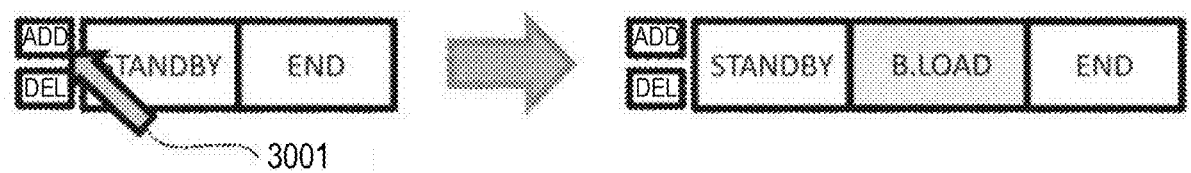
FIG. 12A is a diagram illustrating a step editing process according to the embodiment of the present disclosure.

By using a flow chart of FIG. 5D and an example of display screens of FIGS. 12A to 12D, description is made on one example of the step editing process for adding and deleting a step. As shown in FIG. 12A, in the step editing area A, an "ADD" button for adding a step and a "DEL" button 2008 for deleting a step are displayed (see FIG. 6). "STANDBY" indicating the beginning of the step and "END" indicating the end of the step are always displayed.

As shown in FIG. 12A, when a step is first added, if an operation 3001 of pressing the "ADD" button is performed (if the determination in step S60 is affirmative), the step editing part 46 adds a step "B. LOAD" as a new step after the step "STANDBY" (step S61). Alternatively, if the operation 3001 of pressing the "ADD" button is performed (the determination in step S60 is "Yes"), the step editing part 46 may display a step selection list. If an operation of selecting a step "B. LOAD" from the selection list is performed, the step "B. LOAD" may be displayed in the step editing area A. By inputting a numerical value in a state in which the displayed step "B. LOAD" is selected, the execution time for executing the selected step may be set, and the step "B. LOAD" as a new step may be added after the step "STANDBY" (step S61).

As shown in FIG. 12B, when an operation 3003 of pressing an "ADD" button is performed in a state in which an operation 3002 of selecting a step "STANDBY" is performed in advance, the step editing part 46 adds a step "WAIT1" as the next step of the selected step. When the step is added, the parameter displaying part 43 updates the timing chart T in the parameter editing screen area C so as to take over the analog value indicating the target value of the previous step or the digital value indicating the on/off state. In the example of FIG. 12B, the setting icon 2005 takes over the target value "0" of the step "STANBY" as a value during the step "WAIT", and the setting icon 2006 takes over the off state of the step "STANBY" as a value during the step "WAIT".

Figure 12C:
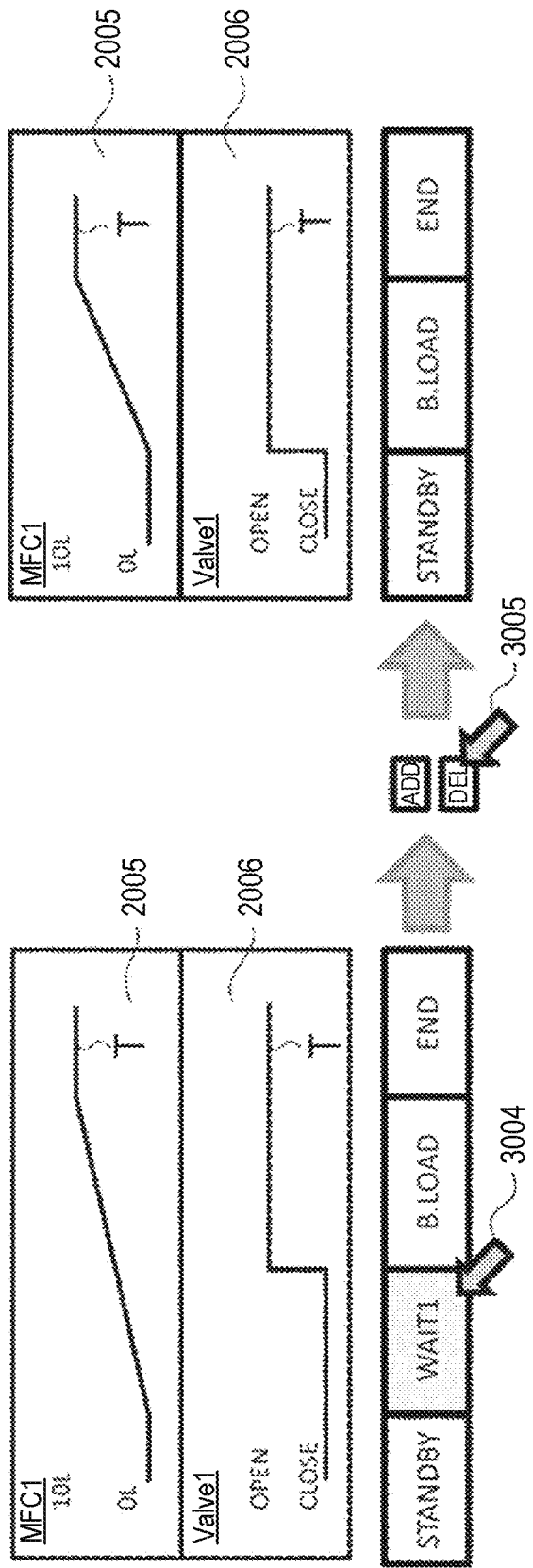
FIG. 12C is a diagram illustrating the step editing process according to the embodiment of the present disclosure.

Further, when deleting a step, as shown in FIG. 12C, if an operation 3005 of pressing a "DEL" button is performed in a state in which an operation 3004 of selecting a step is performed in advance (the determination in step S60 is "No" and the determination in step S62 is "Yes"), the step editing part 46 deletes the target step from the step editing area A (step S63).

When the step is deleted, the parameter displaying part 43 deletes the information of the corresponding step and updates the timing chart T of the parameter editing screen area C. In the example of FIG. 12C, when the step "WAIT" is deleted, the setting icon 2005 takes over the value before the start time of the step "WAIT" as the value of the start time of the step "B.LOAD", and the setting icon 2006 maintains the value after the step "B.LOAD" after the deleted step "WAIT" as it is.

Figure 12D:
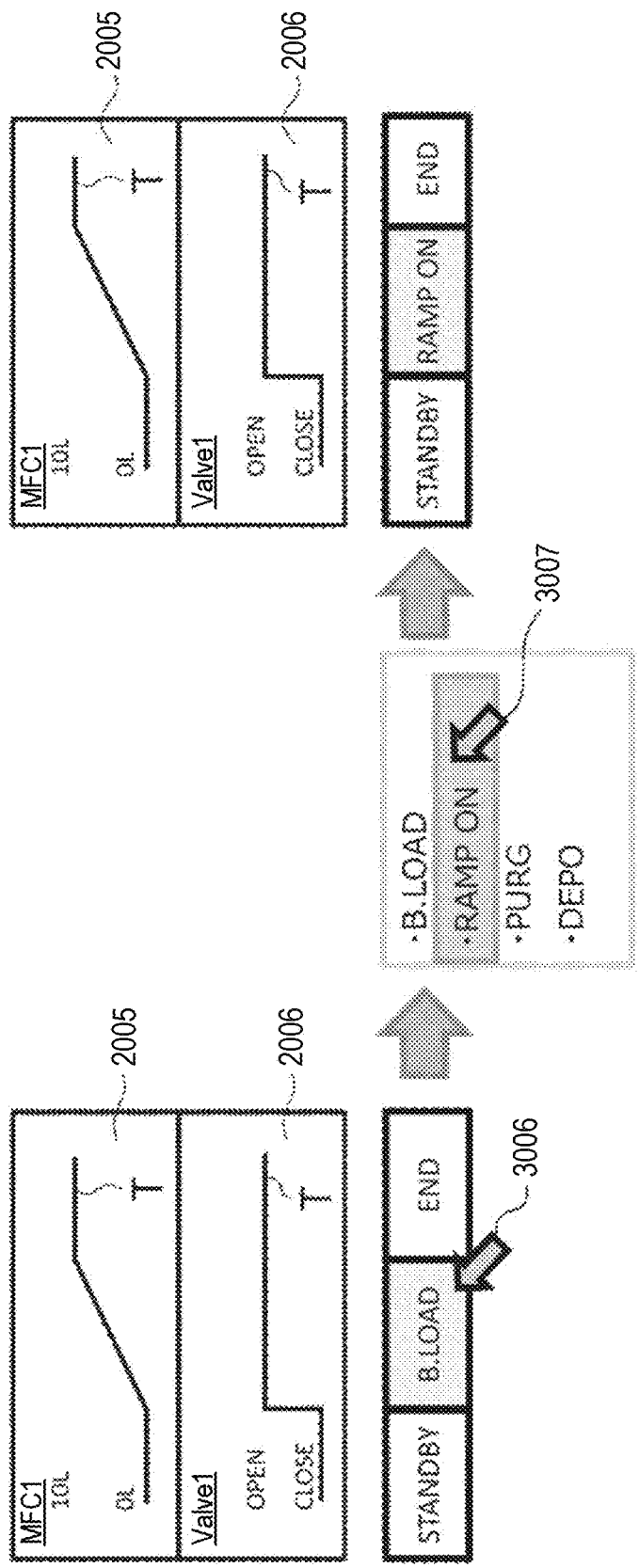
FIG. 12D is a diagram illustrating the step editing process according to the embodiment of the present disclosure.

Further, as shown in FIG. 12D, when a click operation is performed in a state in which an operation 3006 of selecting the step "B. LOAD" is performed (the determinations in step S60 and step S62 are "No" and the determination in step S64 is "Yes"), the step editing part 46 displays a step selection list (step S65). When an operation 3007 of selecting a step "RAMP ON" from the selection list is performed, the step "B. LOAD" is changed to the step "RAMP ON" and displayed in the step editing area A (step S66). Further, by inputting a numerical value on a state in which any of the displayed steps is selected, it is possible to set the execution time for executing the selected step (step S67). In the example of FIG. 12D, the step editing part 46 changes the time range of "RAMP ON" of the timing charts T of the setting icons 2005 and 2006 in conformity with the change in the execution time.

The parameter editing part 45 changes the time included in the parameters of the timing charts T in response to the addition or deletion of the step (step S68). For example, when the parameter indicates a change in the target value, the time at which the target value is reached is changed to the time corresponding to the addition or deletion of the step. When the parameter indicates a change in the on/off state of a part, the time at which the on/off state of a part is switched is changed to the time corresponding to the addition or deletion of the step. When the step is a parameter of the transfer process, the time at which the transfer process is set is changed to the time corresponding to the addition or deletion of the step.

When the step editing process is completed, the process returns to step S6 of the flow chart of FIG. 5A, and waits again for the input of an operation instruction. A recipe is created by performing the recipe editing process as described above one or more times.

When the recipe is created by performing the above editing process one or more times, an operation of switching the recipe editing screen 2001 to another screen is performed. Alternatively, a save button (not shown) may be pressed on the recipe editing screen 2001, and an operation of saving the recipe may be performed. When these operation instructions are inputted (when the determination in step S6 is "Yes," the determinations in steps S7, S9 and S11 are "No," and the determination in step S13 is "Yes"), a save confirmation screen is displayed. When the save is affirmed by the operation person, the consistency check process in the consistency check part 47 is executed (step S15).

The consistency check part 47 checks the consistency of the parameters edited by the parameter editing part 45, and saves the recipe including the edited parameters when the result of the consistency check is normal.

Figure 13:
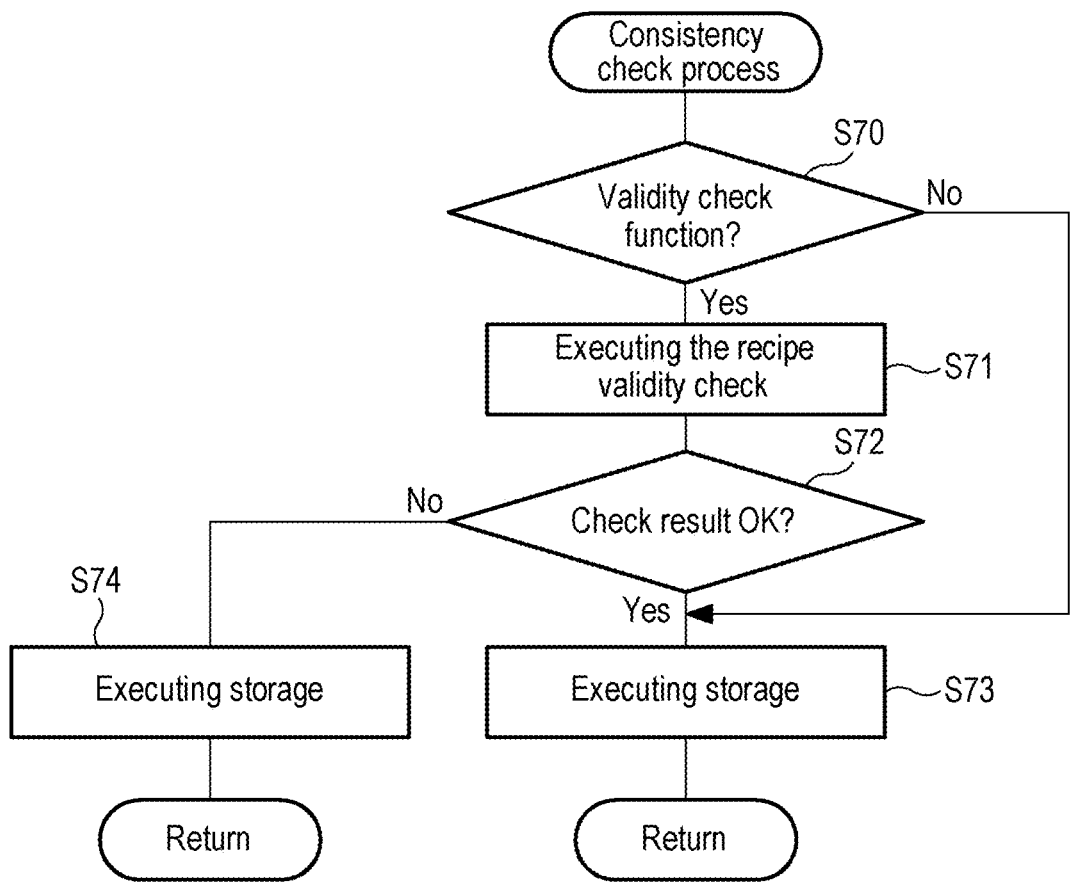
FIG. 13 is a flow chart of a recipe storage process according to the embodiment of the present disclosure.

Next, the processing of the consistency check part 47 will be described with reference to the flow chart of FIG. 13.
(Recipe Validity Check Function)

The consistency check part 47 checks whether a consistency check (also referred to as validity check) function is set (step S70). If the consistency check function is set, the determination in step S70 becomes "Yes". Validity check is performed as to whether there is any inconsistency in the open/closed state of the valve (valve interlock check) and whether there is any inconsistency in the combination of steps (step infinite loop check, etc.) (step S71).

When there is no abnormality (inconsistency) in the validity check result and the check result is normal (the determination in step S72 is "Yes"), the consistency check part 47 saves the edited recipe. Specifically, the recipe is stored in the storage 20 (step S73). On the other hand, when an abnormality (inconsistency) is found (the determination in step S72 is negative), a parameter having an abnormality (inconsistency) is displayed on the recipe editing screen 2001 (step S74). Then, the process is re-executed from step S6 of the recipe editing process shown in the flow chart of FIG. 5A. Specifically, the consistency check part 47 is configured to automatically select a parameter having an abnormality (inconsistency) and display the selected parameter on the display 32 (recipe editing screen 2001) in an editable manner. In this way, it is preferable that the parameter having an abnormality is preferentially displayed on the display 32 so that the parameter having abnormality can be easily re-edited. In addition, the process of saving the created recipe by, for example, pressing a recipe save button cannot be performed while an inconsistency occurs and a consistency is not taken. Moreover, when the abnormality (inconsistency) is found in the validity check result, an alarm may be issued to notify the abnormality to an external controller (not shown) or display the abnormality on the display 32.

As described above, according to the consistency check of the present embodiment, even if an abnormality (inconsistency) occurs as a result of the consistency check performed after the recipe is created, the consistency check part 47 is configured to preferentially display the parameter having an abnormality (inconsistency) on the recipe editing screen 2001 (e.g., the parameter editing screen area C). As a result, editing on the recipe editing screen 2001 (parameter editing screen area C) may be performed until the parameter inconsistency is completely eliminated. Therefore, even if a parameter abnormality (inconsistency) occurs, by merely performing operations on the recipe editing screen 2001 (parameter editing screen area C) regardless of the skill of the operation person, it is possible to create a consistent recipe without human errors such as a parameter setting error and the like.

According to the present embodiment, the save confirmation screen is displayed even when the recipe editing screen 2001 is switched to another screen after the recipe is created and saved. As a result, even if the operation of saving the recipe after creation is forgotten, it is possible to confirm the saving when moving the recipe editing screen 2001 to another screen. This makes it possible to reduce human errors such as an editing error and the like.

Next, a process of executing substrate processing by executing the saved recipe will be described. As a recipe execution program is started after saving the recipe, the main controller 11 functions as the execution part 48 as shown in FIG. 4. Further, in order to execute the recipe and process the wafer 200 in the substrate processing apparatus 100, the execution part 48 outputs a control signal to each of the sub-control parts such as the temperature controller 12, the gas flow rate controller 13, the pressure controller 14, the transfer controller 15, and the like.

Figure 14:
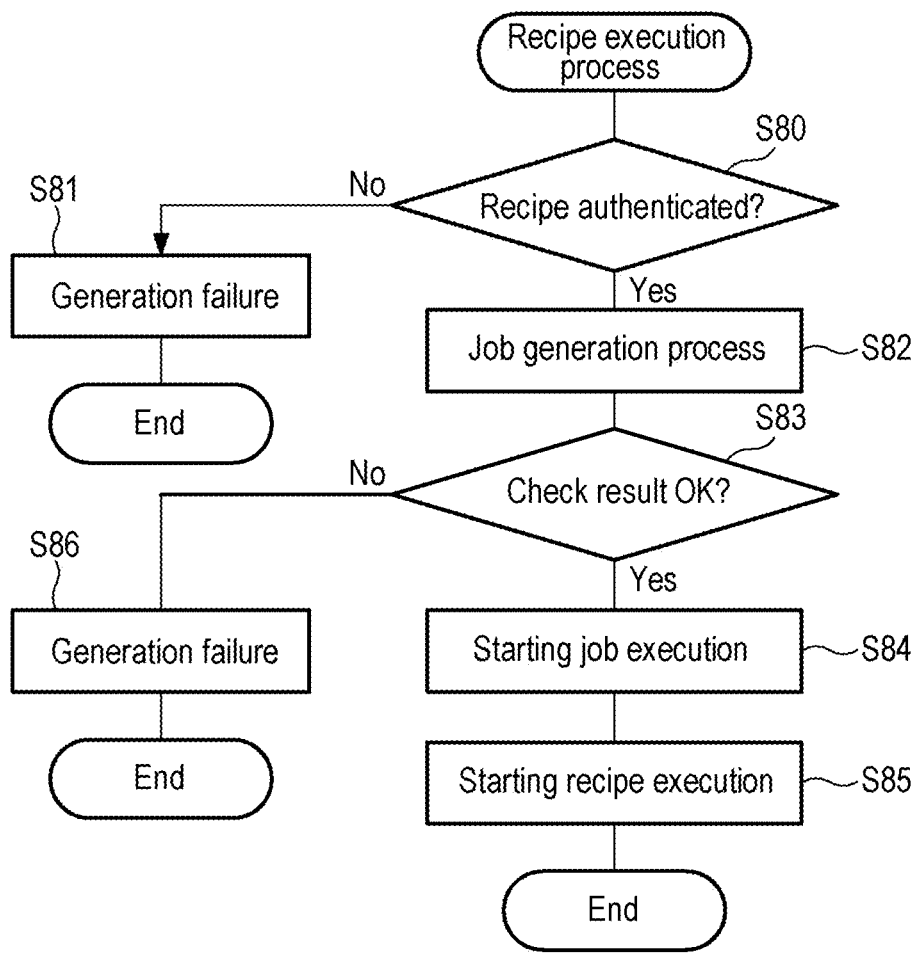
FIG. 14 is a flow chart of a recipe execution process according to the embodiment of the present disclosure.

A flow chart of FIG. 14 shows the flow of a process in which the execution part 48 starts substrate processing. This process is based on the premise that no other automatic operation job exists in the substrate processing apparatus 100 and that the job start method is automatic.

First, it is checked whether the recipe to be executed is authenticated (step S80). If the recipe is not authenticated (the determination in S80 is "No"), the execution process comes to an end without generating an automatic operation job (step S81). If the recipe is authenticated (the determination in step S80 is "Yes"), an automatic operation job is generated (step S82). At this time, if the generation of the automatic operation job fails (step S86), the execution process comes to an end. If the generation of the automatic operation job is successful (the determination in step S83 is "Yes"), the execution of the automatic operation job is started (step S84) and the recipe execution is started (step S85).

Depending on a customer, it is possible to execute the recipe created by the authentication function. In this case, the unauthenticated recipe cannot be executed in the automatic operation job, and the authenticated recipe can be executed in the automatic operation job. As used herein, the term "automatic operation job" refers to a series of commands for receiving instructions from a customer's host computer or an apparatus screen in order to process the wafers 200, transferring the wafers 200 from a cassette to the boat 217, and operating the substrate processing apparatus 100 that executes the recipe.

Next, an operation procedure in the case where the created recipe is executed by the substrate processing apparatus 100 according to the present embodiment to perform a process for the wafers 200 as one process of manufacturing semiconductor devices will be described.

(Pod Transfer Process)

As shown in FIGS. 1 and 2, when the pod 110 is supplied to the load port 114, the pod loading/unloading port 112 is opened by the front shutter 113 and the pod 110 is loaded through the pod loading/unloading port 112. The loaded pod 110 is automatically transferred and delivered to the designated shelf plate 117 of the rotary shelf 105 by the pod transfer device 118.

(Wafer Supply Process)

The pod 110 is temporarily stored on the rotary shelf 105 and is then transferred from the shelf plate 117 to one of the pod openers 121 and delivered to the mounting table 122, or directly transferred from the load port 114 to the pod opener 121 and delivered to the mounting table 122. At this time, the wafer loading/unloading port 120 of the pod opener 121 is closed by the cap attachment/detachment mechanism 123, and the transfer chamber 124 is filled with the clean air 133.

(Wafer Transfer Process)

As shown in FIG. 2, the cap of the pod 110 mounted on the mounting table 122 is removed by the cap attachment/detachment mechanism 123, and the wafer loading/unloading port of the pod 110 is opened. Further, the wafer 200 is picked up from the pod 110 by the wafer transfer device 125a, and is transferred and charged to the boat 217. The wafer transfer device 125a, which has transferred the wafer 200 to the boat 217, returns to the pod 110 and charges the next wafer 200 to the boat 217.

During the charging operation of the wafer 200 to the boat 217 by the wafer transfer device 125a in one (upper or lower) pod opener 121, another pod 110 is transferred from the rotary shelf 105 or the load port 114 to the other (lower or upper) pod opener 121 by the pod transfer device 118, and the opening work of the pod 110 by the pod opener 121 is simultaneously performed. In this way, a predetermined number of wafers 200 are charged to the boat 217 (wafer charging process).

(Loading Process)

When a predetermined number of wafers 200 are charged to the boat 217, the lower end of the process furnace 202 is opened by the furnace opening gate valve 147. Subsequently, the seal cap 219 is lifted by the boat elevator 115, and the boat 217 supported by the seal cap 219 is loaded into the process chamber in the process furnace 202 (wafer loading process).

After the boat 217 is loaded, a predetermined process is performed on the unprocessed wafers 200 held by the boat 217 loaded into the process chamber. Specifically, for example, when a film-forming process is performed by a thermal CVD reaction, exhaust is performed by using the exhaust device so that the process chamber has a desired pressure (vacuum degree). Then, the process chamber is heated by using the heater, and the rotator is operated to rotate the boat 217. The wafers 200 are also rotated accordingly. The rotation of the wafers 200 continues until the boat 217 is unloaded. Furthermore, a precursor gas, a purge gas and the like are supplied from the gas introduction pipe to the process chamber. As a result, a thin film is formed on the surfaces of the untreated wafers 200 held on the boat 217 by utilizing a thermal decomposition reaction, a chemical reaction, or the like.

After the processing, the boat 217 is unloaded by the boat elevator 115 (wafer unloading process). Thereafter, the wafers 200 and the pod 110 are discharged to the outside of the housing 111 in the reverse order of the procedure described above.

As described above, according to the present embodiment, at least one of the following effects may be obtained.

(1) According to the present embodiment, by setting the parameters on the recipe editing screen, editing can be performed while checking the flow of a change of each setting item of the entire recipe. Reduction of editing errors can be expected because there is no need for a step-by-step operation or a work of editing while considering the numerical values before and after a step.

(2) According to the present embodiment, the parameters of a plurality of steps can be displayed on the same screen during parameter editing, and a recipe can be created while referring to the contents of other steps. The recipe check time can be shortened, and the work efficiency can be improved.

(3) According to the present embodiment, the recipe can be edited without specifying the opening/closing of the valve provided on the same gas line as the mass flow controller. Therefore, it may not worry about the interlock generation pattern, which makes it possible to greatly reduce the editing operations. Accordingly, the editing operations performed by a person can be largely omitted, which makes it possible to reduce the editing errors.

(4) According to the present embodiment, a check function is provided when saving the created recipe, and the abnormal point found as a result of the check can be immediately re-edited. Therefore, it is possible to suppress a situation where even when there is an editing error in the recipe creation, the recipe (having a setting error) is executed as it is and the substrate processing apparatus is locked out.

In the case of a vertical heat treatment apparatus, a process is performed after impurities existing in the air are removed by depressurizing the inside of a furnace to a vacuum state after the wafers 200 are loaded into the furnace. At this time, the evacuation sequence is often in almost the same step order even for different recipes, and the set value parameters thereof are also used without being changed. Further, there are present steps always used in the recipe, such as a step of returning from the vacuum state to the atmosphere (slow purge), a step of introducing (loading) the boat 217 on which the wafers 200 are mounted into the furnace, a step of raising the temperature inside the furnace to the process temperature, a step of discharging the boat 217 from within the furnace, and the like.

Further, when another recipe serving as a base is selected instead of creating a new recipe and the recipe is copied and then edited, the setting value is originally entered in the base recipe. Therefore, if an operation person who is not accustomed to editing a recipe performs an operation operates the recipe, there may occur a mistake in which the operation person forgets to edit the recipe that must be edited. However, in the present embodiment, the step to be edited can be displayed on the recipe editing screen (parameter editing screen area) for editing the parameter in advance. Therefore, there is no mistake of forgetting to edit the step that must be edited.

In addition, even when a new recipe is created in response to a change in the film type due to the modification of the substrate processing apparatus, the steps themselves constituting the recipe as well as the parameters can be edited on the recipe editing screen. Moreover, the recipe can be edited without designating the opening/closing of the valve, and the transfer parameters of each transfer mechanism can also be set on the recipe editing screen. Therefore, even a worker who is not accustomed to editing a recipe can create a recipe in a relatively easy manner.

The present disclosure can be applied to a glass substrate processing apparatus such as an LCD manufacturing apparatus or the like, and other substrate processing apparatuses as well as the semiconductor manufacturing apparatus. The contents of the substrate processing may be an annealing process, an oxidation process, a diffusion process, an etching process, an exposing process, a lithography process, a coating process, a molding process, a developing process, a dicing process, a wire bonding process, an inspection process or the like, as well as a CVD, a PVD (Physical Vapor Deposition), or film formation processes for forming an epitaxial growth film, an oxide film, a nitride film, a metal-containing film and the like.

According to the present disclosure in some embodiments, it is possible to improve the efficiency of an editing work on a recipe editing screen and to reduce editing errors.

While certain embodiments have been described, these embodiments have been presented by way of example, and are not intended to limit the scope of the disclosures. Furthermore, various omissions, substitutions and changes in the form of the embodiments described herein may be made without departing from the spirit of the disclosures.

What is claimed is:

1. A recipe creation method, comprising:
    displaying, on a display of a substrate processing apparatus, a recipe editing screen including:
        a step editing area that displays a series of steps that are performed in substrate processing according to a target recipe file to be subjected to recipe creation,
        a selection screen area that displays a parameter list for selection of parameters included in the target recipe file, and
        a parameter editing screen area that edits the parameters;
    receiving a selection operation that selects an editing target parameter from the parameter list displayed on the selection screen area;
    displaying, on the parameter editing screen area, in an editable manner, a timing chart that is changeable at a time of each step in the series of steps; and
    editing the editing target parameter by receiving an operation instruction to edit the timing chart displayed on the parameter editing screen area and changing the timing chart according to the operation instruction.

2. The method of claim 1, wherein the editing target parameter indicates a target value to be targeted in the substrate processing performed by the substrate processing apparatus, and a time at which the target value is reached,
    wherein the timing chart indicates a change in the target value at the time of each process,
    wherein the operation instruction is an instruction to move a point on the timing chart displayed in the parameter editing screen area, and
    wherein in the act of editing the editing target parameter, the target value of a parameter, which corresponds to the timing chart where the instruction to move the point is given, at a time corresponding to the point is changed from a target value represented by a point before the movement to a target value represented by a point after the movement.

3. The method of claim 1, wherein the editing target parameter indicates a time at which a state of a part of the substrate processing apparatus is turned on or off,
    wherein the timing chart indicates whether the state of the part is on or off at the time of each step,
    wherein the operation instruction is an instruction to switch the state at a point on the timing chart between off and on by indicating the point on the timing chart displayed on the parameter editing screen area, and
    wherein in the act of editing the editing target parameter, the editing target parameter corresponding to the timing chart is edited by changing the state at a time corresponding to the point to a state according to the operation instruction.

4. The method of claim 1, wherein the operation instruction is an instruction to change a display order of the timing chart displayed on the parameter editing screen area, and
    wherein in the act of displaying the timing chart, the display order of the timing chart is changed according to an instruction to change the display order of the editing target parameter corresponding to the timing chart.

5. The method of claim 1, wherein the operation instruction is an instruction to hide the timing chart displayed on the parameter editing screen area, and
    wherein in the act of displaying the timing chart, the timing chart to which the instruction to hide is given is hidden.

6. The method of claim 1, wherein the editing target parameter indicates a start time and an end time of each of plural types of transfer processes performed in the substrate processing apparatus,
    wherein the timing chart indicates a start time and an end time of each of the transfer processes according to the time of each step,
    wherein the operation instruction is an instruction to change the start time or the end time of a type of a transfer process selected from the plural types of transfer processes according to the time of each step, and
    wherein in the act of editing the editing target parameter, a parameter of the changed transfer process is changed according to the start time or the end time of the changed transfer process.

7. The method of claim 1, wherein in the act of displaying the timing chart, a time range from a start time to an end time of each step in the series of steps is displayed on the recipe editing screen such that correspondence between the start time and the end time of each step in the series of steps and a time of the timing chart is recognizable.

8. The method of claim 7, further comprising adding a new step before or after a specific step in the series of steps, or deleting a specific step from the series of steps,
    wherein in the act of displaying the timing chart, a range of the timing chart of the parameter editing screen area corresponding to the added step is expanded along a time axis, or a range of the timing chart of the parameter editing screen area corresponding to the deleted step is reduced along a time axis, and
    wherein in the act of editing the editing target parameter, a time included in the parameter of the timing chart is changed in response to the addition or the deletion of the specific step.

9. The method of claim 1, further comprising performing a consistency check for the parameter edited in the act of editing the editing target parameter and saving a recipe including the edited parameter when a result of the consistency check is normal.

10. The method of claim 1, wherein in the act of receiving the selection operation, a selection operation that selects an editing target parameter from a group consisting of parameters related to substrate processing and parameters related to substrate transfer is received, wherein in the act of displaying the timing chart, a setting icon that sets the editing target parameter selected by the selection operation is displayed on the parameter editing screen area in an editable manner, and wherein in the act of editing the editing target parameter, the editing target parameter is edited by receiving an operation instruction to edit the setting icon that sets the editing target parameter displayed on the parameter editing screen area, and changing the display in the setting icon according to the operation instruction.

11. The method of claim 10, wherein the setting icon is selected from the group consisting of a setting icon used for the case where a setting value that sets the editing target parameter is an analog value, a setting icon used for the case where a setting value that sets the editing target parameter is a digital value, and a setting icon used for the case where a setting value that sets the editing target parameter is a command value.

12. A semiconductor device manufacturing method, comprising:
processing a substrate by allowing the substrate processing apparatus to execute a recipe obtained by executing the recipe creation method of claim 1.

13. A substrate processing apparatus, comprising:
a controller configured to:
display a recipe editing screen including:
a step editing area that displays a series of steps that are performed in substrate processing according to target recipe file to be subjected to recipe creation; and
a selection screen area that displays a parameter list for selection of parameters included in the target recipe file that processes a substrate and a parameter editing screen area that edits the parameters;
receive a selection operation that selects an editing target parameter from the parameter list displayed on the selection screen area;
display, on the parameter editing screen area in an editable manner, a timing chart that is changeable at a time of each step in the series of steps; and
edit the editing target parameter by receiving an operation instruction to edit the timing chart displayed on the parameter editing screen area and changing the timing chart according to the operation instruction; and
an operator configured to create a recipe to select the editing target parameter, display a timing chart corresponding to the selected editing target parameter on the parameter editing screen area, and edit a parameter corresponding to the edited timing chart according to the edited timing chart,
wherein the controller is further configured to process the substrate by executing the recipe.

14. A non-transitory computer-readable recording medium storing a recipe creation program that causes, by a computer, a substrate processing apparatus to perform a process comprising:
displaying, on a display of a substrate processing apparatus, a recipe editing screen including:
a step editing area that displays a series of steps that are performed in substrate processing according to a target recipe file to be subjected to recipe creation;
a selection screen area that displays a parameter list for selection of parameters included in the target recipe file; and
a parameter editing screen area that edits the parameters;
receiving a selection operation that selects an editing target parameter from the parameter list displayed on the selection screen area;
displaying, on the parameter editing screen area, in an editable manner, a timing chart that is changeable at a time of each step in the series of steps; and
editing the editing target parameter by receiving an operation instruction to edit the timing chart displayed on the parameter editing screen area and changing the timing chart according to the operation instruction.

15. The non-transitory computer-readable recording medium of claim 14, wherein in the act of displaying the timing chart, a setting icon that sets a parameter related to substrate processing and a parameter related to substrate transfer selected by the selection operation is displayed on the parameter editing screen area in an editable manner, and in the act of editing the editing target parameter, the editing target parameter is edited by receiving an operation instruction to edit the setting icon that sets the parameter displayed on the parameter editing screen area, and changing the display in the setting icon according to the operation instruction.

* * * * *